(12) United States Patent
Enkaku

(10) Patent No.: US 7,334,174 B2
(45) Date of Patent: Feb. 19, 2008

(54) SEMICONDUCTOR INTEGRATED CIRCUIT DEVICE AND ERROR DETECTING METHOD THEREFOR

(75) Inventor: Motohiro Enkaku, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 304 days.

(21) Appl. No.: 10/806,244

(22) Filed: Mar. 23, 2004

(65) Prior Publication Data

US 2005/0050421 A1    Mar. 3, 2005

(30) Foreign Application Priority Data

Aug. 29, 2003 (JP) .............................. 2003-306786

(51) Int. Cl.
*G01R 31/28* (2006.01)
(52) U.S. Cl. .................. 714/735; 714/736; 714/13; 714/35; 714/6; 714/15
(58) Field of Classification Search ............... None
See application file for complete search history.

(56) References Cited

U.S. PATENT DOCUMENTS

| 4,185,323 A | | 1/1980 | Johnson et al. | |
|---|---|---|---|---|
| 4,287,594 A | * | 9/1981 | Shirasaka | 714/736 |
| 5,182,752 A | * | 1/1993 | DeRoo et al. | 714/758 |
| 5,958,080 A | * | 9/1999 | Kang | 714/807 |
| 6,260,172 B1 | * | 7/2001 | Hazama | 714/773 |
| 6,490,219 B2 | * | 12/2002 | Yoneya et al. | 365/225.7 |
| 6,560,734 B1 | * | 5/2003 | Whetsel | 714/724 |
| 6,615,379 B1 | * | 9/2003 | Tripp et al. | 714/736 |
| 6,892,318 B2 | * | 5/2005 | Blodgett | 714/7 |
| 7,243,260 B2 | * | 7/2007 | Ono | 714/13 |
| 2001/0054166 A1 | * | 12/2001 | Fukuda | 714/733 |

FOREIGN PATENT DOCUMENTS

| JP | 8-110877 | | 4/1996 |
|---|---|---|---|
| JP | 9-282237 | | 10/1997 |
| JP | 09282237 A | * | 10/1997 |
| JP | 11-39224 | | 2/1999 |

* cited by examiner

*Primary Examiner*—James C. Kerveros
*Assistant Examiner*—Steven D Radosevich
(74) *Attorney, Agent, or Firm*—Oblon, Spivak, McClelland, Maier & Neustadt, P.C.

(57) ABSTRACT

A semiconductor integrated circuit device includes a programmable circuit in which information is programmed, an information holding circuit which electrically holds information programmed in the programmable circuit, a compression circuit which compresses information held in the information holding circuit, an information output circuit which outputs expected value information, and a detection circuit which checks whether information held in the information holding circuit is destroyed or not. The detecting circuit compares expected value information of the information output circuit with compression information of the information compression circuit to check destruction of information held in the information holding circuit.

7 Claims, 19 Drawing Sheets

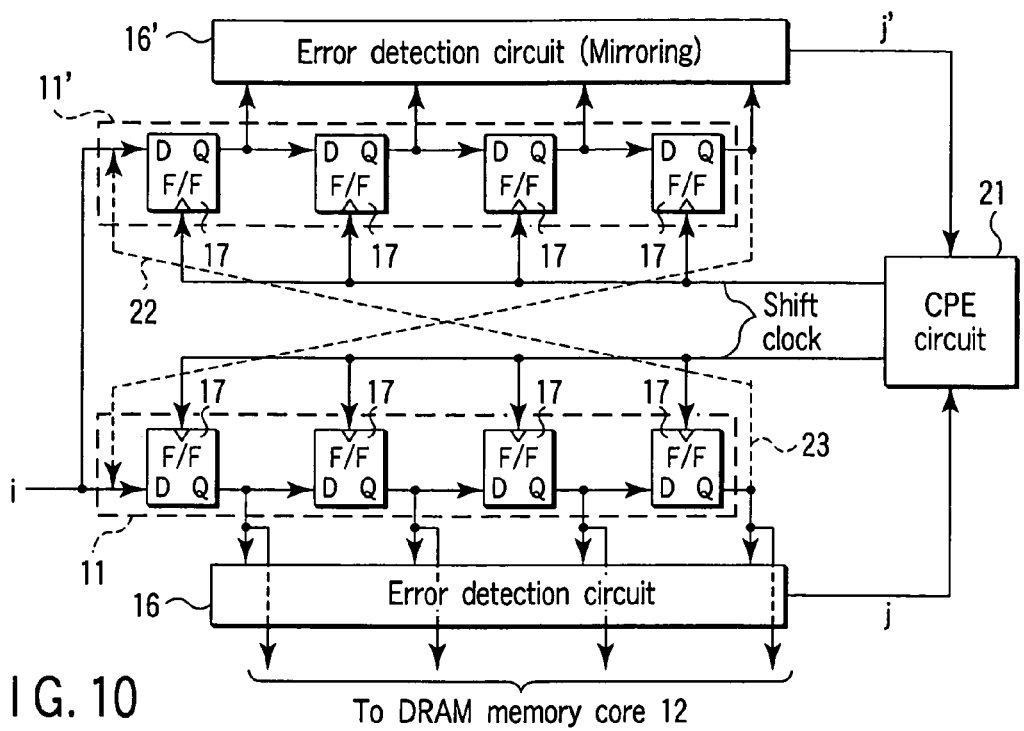
F I G. 10
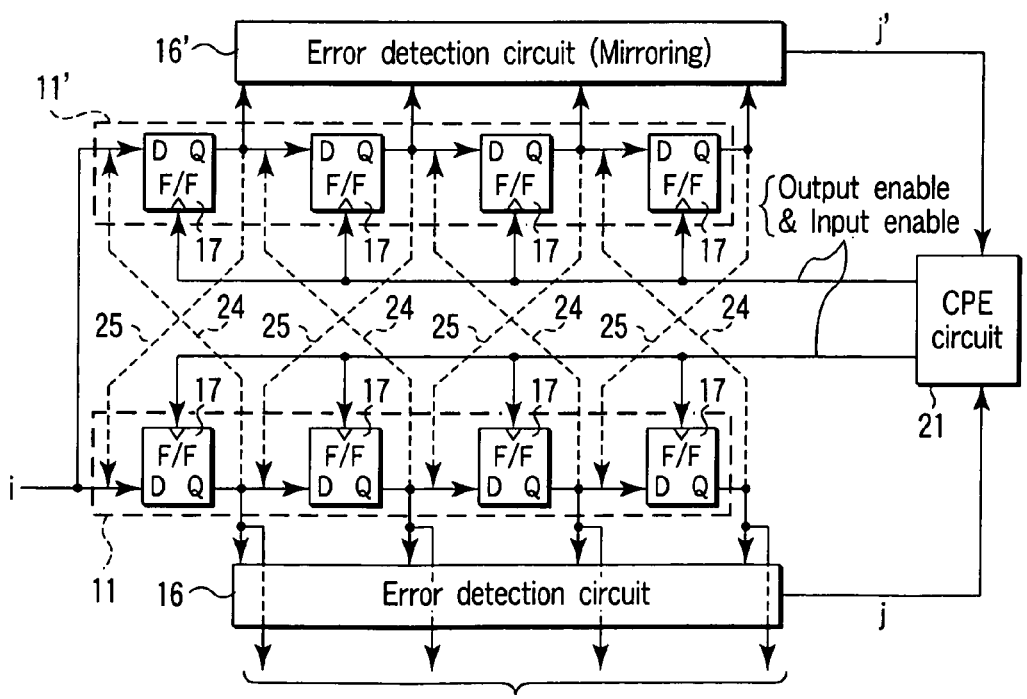
F I G. 11

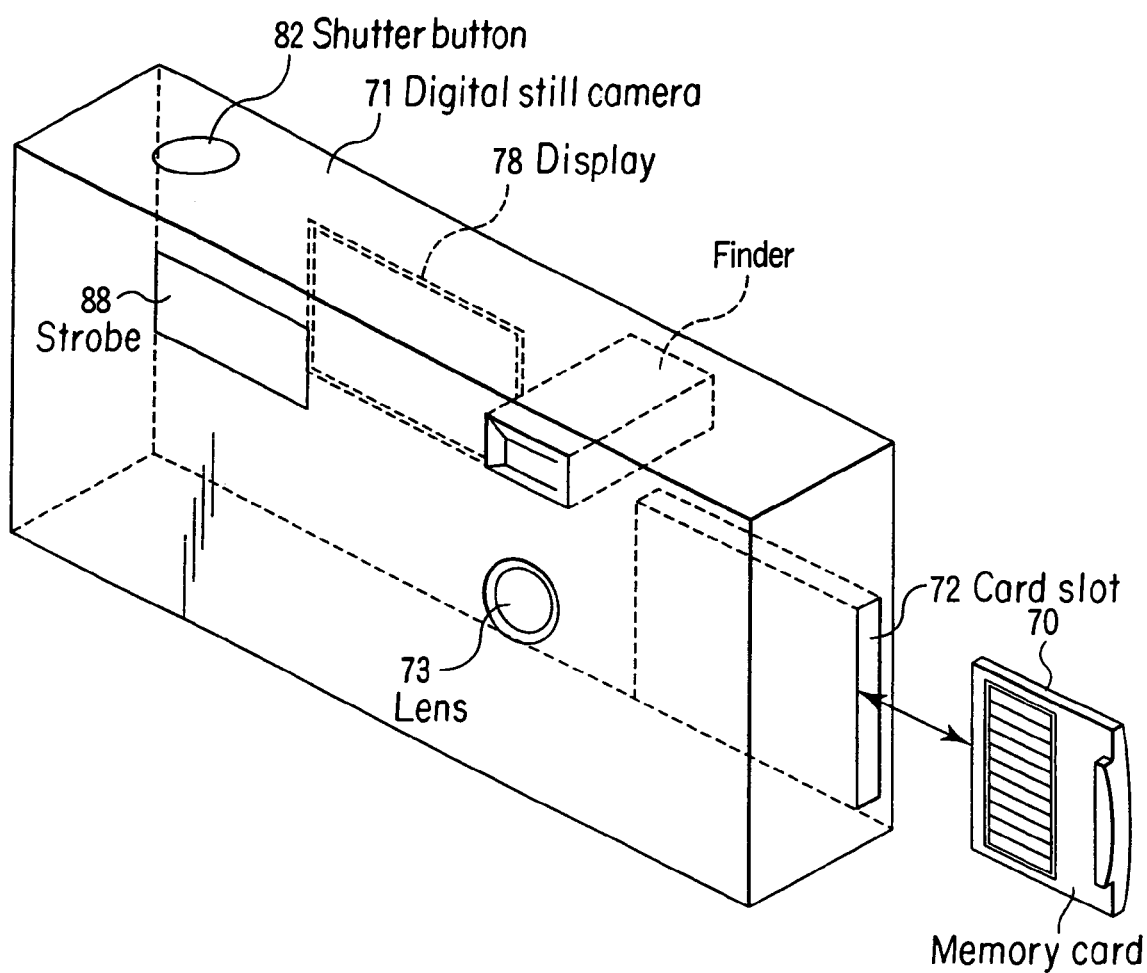
F I G. 25

SEMICONDUCTOR INTEGRATED CIRCUIT DEVICE AND ERROR DETECTING METHOD THEREFOR

CROSS-REFERENCE TO RELATED APPLICATIONS

This application is based upon and claims the benefit of priority from the prior Japanese Patent Application No. 2003-306786, filed Aug. 29, 2003, the entire contents of which are incorporated herein by reference.

BACKGROUND OF THE INVENTION

1. Field of the Invention

This invention relates to a semiconductor integrated circuit device and more particularly to a semiconductor integrated circuit device having a fuse box and a register which holds information transferred from the fuse box, and an error detecting method for checking destruction of information held in the register.

2. Description of the Related Art

Electrical fuses (for example, current fusible type fuses) and optical fuses (for example, laser fusible type fuses) can each be used to program information of 0/1 according to cutoff/non-cutoff of an electrical path. That is, the fuse is a type of programmable ROM, and since information can be programmed according to physical destruction of cutoff/non-cutoff of the electrical path, the storage holding characteristic is semi-permanent. Due to the above advantage, recently, fuses have received much attention as means for programming information which is required to be semi-permanently programmed in the semiconductor integrated circuit device, thus are widely used. Information which is required to be semi-permanently programmed, is, for example, redundancy information of a semiconductor memory.

However, the fuse is accompanied by physical destruction when programming. Therefore, during the programming, an accident in which a semiconductor device in the semiconductor integrated circuit chip will be destroyed may occur in some cases. In a recent semiconductor integrated circuit device, the above problem is solved by collectively arranging fuses in a region called a fuse box and isolating them from an internal macro region in which the integration density of the semiconductor device is high.

However, the fuse box is provided in a portion separated from the internal macro region. Therefore, if access is made to the fuse box from the internal macro region, the operation speed will be extremely lowered. Therefore, a method for transferring information read out from the fuse box to a temporary storage circuit, for example, a register provided in the internal macro region and holding the information programmed in the fuses in the register is used.

As a prior art reference in which the technique for transferring information programmed in the fuses to the register is described, for example, U.S. Patent Publication No. 6,490,219 is given.

BRIEF SUMMARY OF THE INVENTION

A semiconductor integrated circuit device according to a first aspect of the present invention comprises a programmable circuit in which information is programmed; an information holding circuit which electrically holds information programmed in the programmable circuit; a compression circuit which compresses information held in the information holding circuit; an information output circuit which outputs expected value information; and a detecting circuit which compares the expected value information with compression information of the information compression circuit to check destruction of information held in the information holding circuit.

A semiconductor integrated circuit device according to a second aspect of the present invention comprises a programmable circuit in which information is programmed; an information holding circuit which electrically holds information programmed in the programmable circuit; a compression circuit which compresses information held in the information holding circuit; and an information output circuit which outputs expected value correcting information used to correct compression information compressed by the information compression circuit to expected value information; wherein destruction of information stored in the information holding circuit is checked based on a variation in the expected value information.

BRIEF DESCRIPTION OF THE SEVERAL VIEWS OF THE DRAWING

FIG. 10 is a diagram showing a case wherein information is transferred in a serial fashion;

FIG. 11 is a diagram showing a case wherein information is transferred in a parallel fashion;

FIG. 25 is a perspective view showing a digital still camera; and

DETAILED DESCRIPTION OF THE INVENTION

There will now be described embodiments of this invention with reference to the accompanying drawings. In the following explanation, common reference symbols are attached to common portions throughout the drawings.

Information held in the register must be always correctly held in a period in which a semiconductor integrated circuit device is operated. However, the register is an electrical storage circuit which stores information not physically but electrically, thus there is a possibility that information held therein will be destroyed due to incidental events such as soft errors.

In the following embodiments, a semiconductor integrated circuit device capable of detecting that information held therein will be incidentally destroyed and an error detecting method thereof are explained.

First Embodiment

As an embodiment of a semiconductor integrated circuit device according to the present invention, a system-on-chip, for example, a DRAM hybrid logic device is shown in a first embodiment. However, this invention is not limited to the DRAM hybrid logic device.

Figure 1:
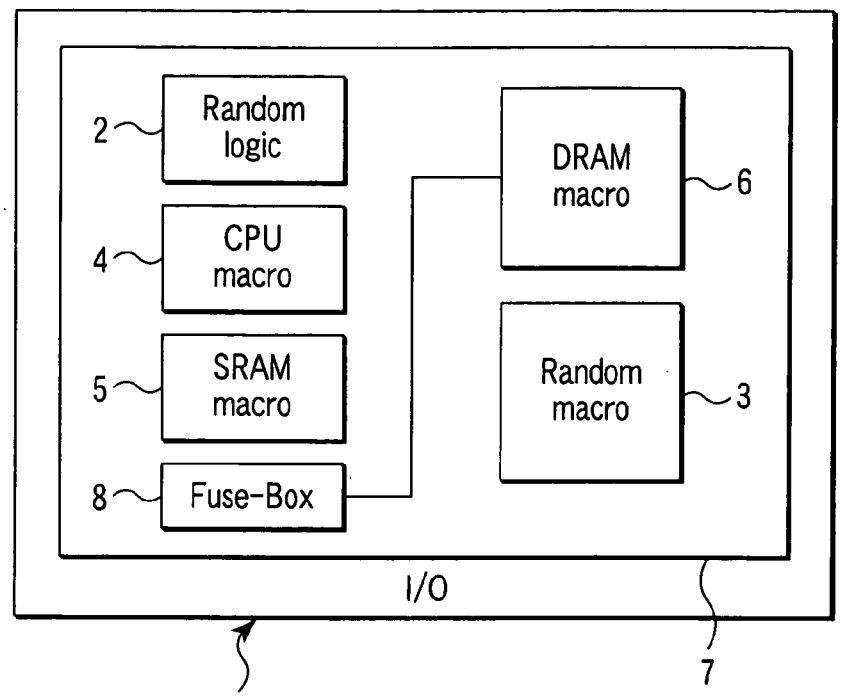
FIG. 1 is a block diagram showing one example of the configuration of a semiconductor integrated circuit device according to a first embodiment of the present invention.

FIG. 1 is a block diagram showing one example of the configuration of the semiconductor integrated circuit device according to the first embodiment of the present invention.

As shown in FIG. 1, the semiconductor integrated circuit device according to the first embodiment includes IP (Intellectual Property) macros in addition to random logics 2, 3 on one semiconductor chip 1. In this example, a CPU macro 4, SRAM macro 5 and DRAM macro 6 correspond to the IP macros. An I/O circuit 7 is arranged outside the IP macros, that is, on the peripheral portion of the chip 1. In this example, a fuse box 8 is provided in a portion separated from the DRAM macro 6. The fuse box 8 is a region in which a programmable circuit having information programmed therein is integrated. The programmable circuit is electrically connected to the DRAM macro 6. One circuit example of the fuse box 8 is shown in FIG. 2.

Figure 2:
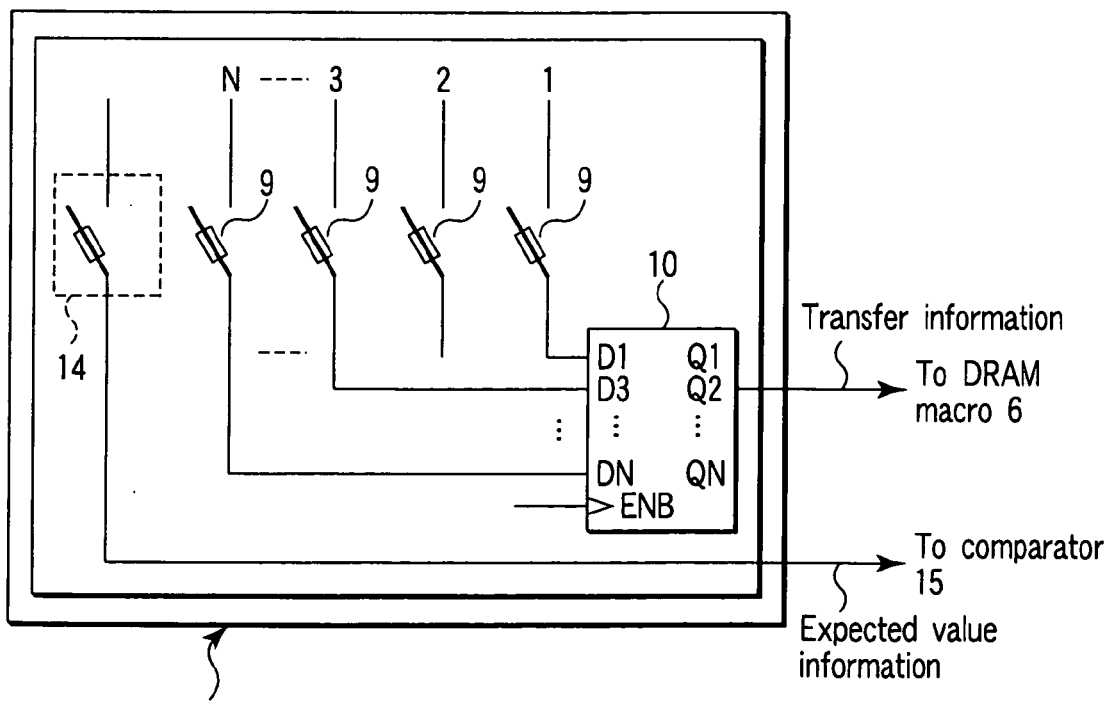
FIG. 2 is a circuit diagram showing one circuit example of a fuse box.

As shown in FIG. 2, in the fuse box 8 associated with one circuit example, fuses 9 are arranged as the programmable circuit. For example, the fuses 9 are electrical fuses or optical fuses. As an example of the electrical fuse, for example, a current fusible type fuse in which the wiring thereof is melted by an excessively large current or an anti-fuse which electrically destroys a capacitor can be given. As an example of the optical fuse, for example, a laser fusible type fuse in which the wiring thereof is melted by application of a laser beam or a cutting type fuse in which the wiring thereof is cut off by sputtering by use of a focused ion beam can be given. The fuses 9 are connected in parallel to a register 10 arranged in the fuse box 8. For example, the register 10 is operated based on an enable signal ENB, converts information read out in parallel from the fuses 9 into a serial form and inputs the same to the DRAM macro 6. One circuit example of the DRAM macro 6 is shown in FIG. 3.

Figure 3:
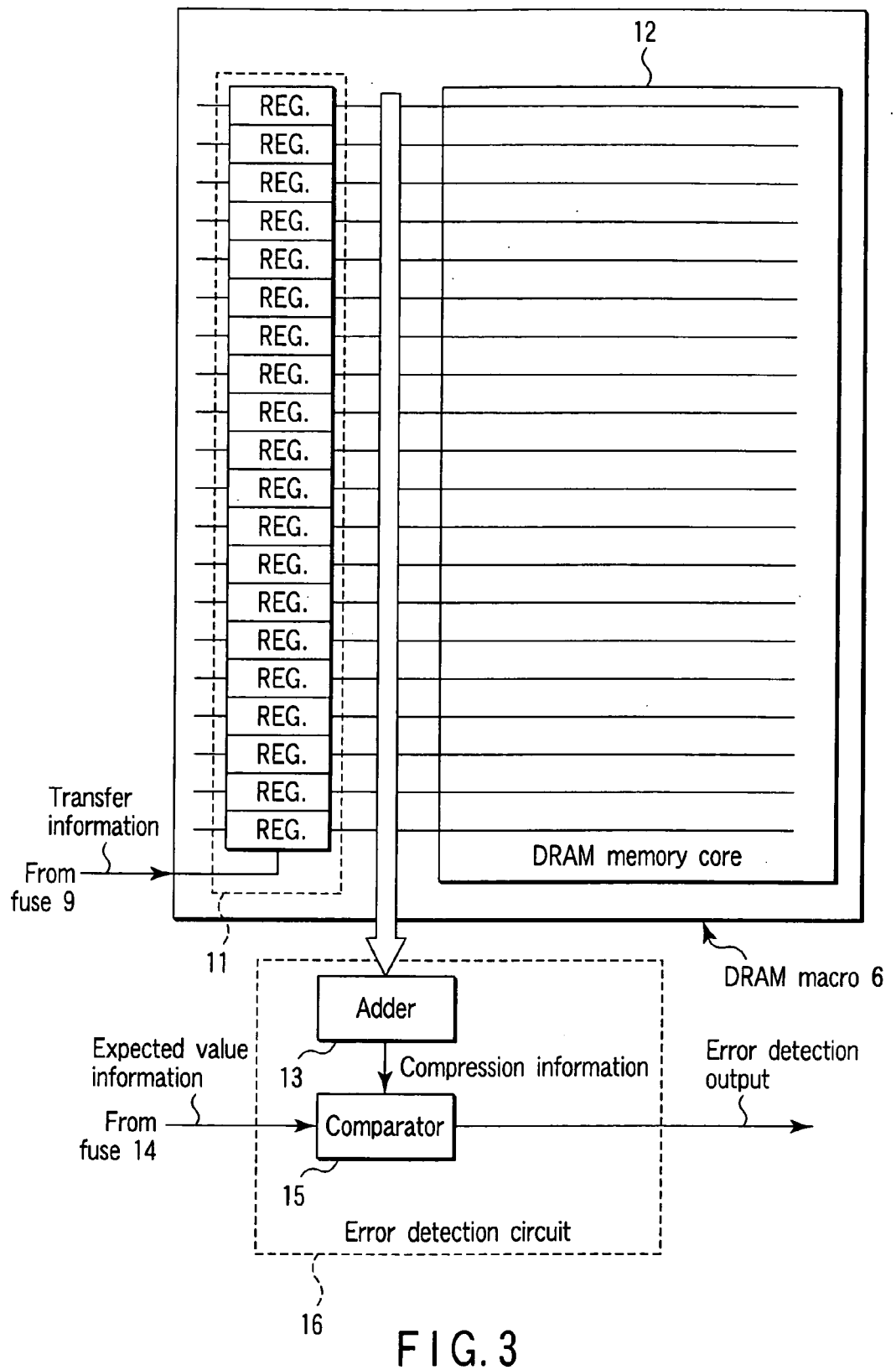
FIG. 3 is a circuit diagram showing one circuit example of a DRAM macro.

As shown in FIG. 3, in the DRAM macro 6, a transfer register 11 and DRAM memory core 12 are integrated. The transfer register 11 is an information holding circuit which electrically holds information programmed in the fuses 9, that is, in the programmable circuit. Information from the fuses 9 is serially input to and held in the transfer register 11. For example, information programmed in the fuses 9 is information which is required to be semi-permanently programmed in a semiconductor integrated circuit device. As an example of such information, for example, redundancy information of the DRAM macro 6 is used. In this case, for example, the transferring type register 11 holds faulty address information and when access is hit on a faulty address, access destination is changed so that a corresponding spare address will be accessed. Of course, information which is required to be semi-permanently programmed is not limited to redundancy information, but various information items such as so-called trimming information used to finely adjust the data input/output timing can be used. Information held in the transferring type register 11 is supplied to the DRAM memory core 12. Although not shown in the drawing, a memory cell array, sense amplifiers, row/column decoder, an interface circuit used to transfer readout information or written information between the DRAM macro 6 and another macro or between the DRAM macro 6 and a system outside the chip 1 and the like are provided in the DRAM memory core 12.

In the first embodiment, a compression circuit to compress information held in the transferring type register 11 is further provided. The compression circuit is arranged outside or inside the DRAM macro 6. In this example, as one example of the compression circuit, an adder circuit 13 is provided. The adder circuit 13 adds together information items held in the transferring type register 11. Particularly, in this example, a 1-bit adder circuit is used and the 1-bit adder circuit outputs data indicating that the total sum of the information items held in the transferring type register 11 obtained as the result of addition becomes even ("0") or odd ("1"). Thus, information held in the transferring type register 11 is compressed to 1-bit information of "0" or "1".

Further, in the first embodiment, an information output circuit which outputs expected value information is provided. In this example, as one example of the information output circuit, a fuse 14 is used. The fuse 14 is arranged in the fuse box 8 in this example. Expected value information, for example, 1-bit information of "0" or "1" is programmed in the fuse 14. A comparator circuit 15 compares expected value information with compression information of the 1-bit adder. The comparator circuit 15 is a detecting circuit which detects that information held in the transferring type register 11 is destroyed or not by comparing the expected value information with the compression information. In the following explanation in the specification, destruction of information is called an "error". For example, if it is determined "correct" when the expected value information "coincides" with the compression information, the comparator circuit 15 functions to detect "non-coincidence" and detect that an error occurs in the transferring type register 11. That is, when an error occurs in the transferring type register 11, compression information of the 1-bit adder is inverted. The comparator circuit 15 detects inversion of the information and outputs an error detection output indicating that an error has occurred.

On the other hand, it is possible to determine "correct" when the expected value information "does not coincide" with the compression information. In this case, the comparator circuit 15 functions to detect "coincidence". Like the former case, when the comparator circuit 15 detects inversion of the compression information, it outputs an error detection output.

Thus, the semiconductor integrated circuit device according to the first embodiment includes an error detecting circuit 16 which contains the adder circuit (compression circuit) 13 and comparator circuit (detecting circuit) 15.

According to the semiconductor integrated circuit device of the first embodiment, since the error detecting circuit 16 is provided, it is possible to detect that information held in the transferring type register 11 is accidentally destroyed due to occurrence of a soft error, for example, and detect that an error has occurred. Since occurrence of an error can be detected, for example, an erroneous operation of the semiconductor integrated circuit device caused by destruction of information held in the transferring type register 11 can be prevented and the reliability of the semiconductor integrated circuit device can be enhanced.

Second Embodiment

A second embodiment relates to another detecting method for detecting occurrence of an error.

In the first embodiment, occurrence of an error is detected by comparing the compression information with the expected value information and detecting "coincidence" or "non-coincidence". In the second embodiment, compression information is corrected to a preset constant value and used as expected value information. Occurrence of an error is detected based on whether the expected value information has varied or not. The second embodiment is different from the first embodiment only in the detecting method. Therefore, only a different portion is explained.

First Circuit Example

Figure 4:
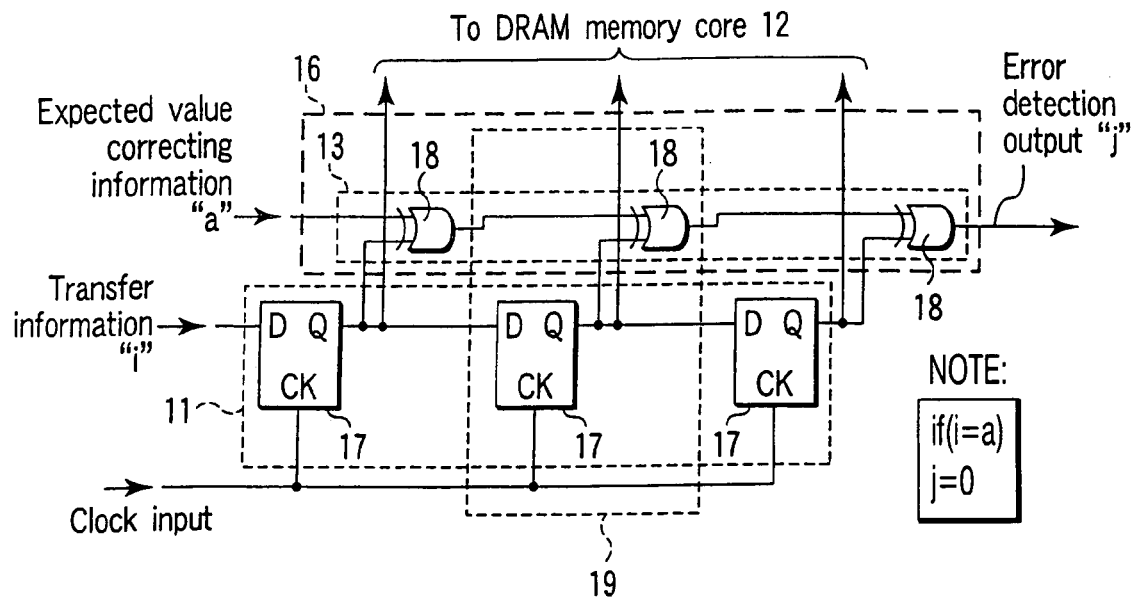
FIG. 4 is a circuit diagram showing a first circuit example of an information holding circuit and error detecting circuit of a semiconductor integrated circuit device according to a second embodiment of the present invention.

FIG. 4 is a circuit diagram showing a first circuit example of an information holding circuit and error detecting circuit of a semiconductor integrated circuit device according to the second embodiment of the present invention.

As shown in FIG. 4, transfer information i transferred from the fuse box 8 is input to a transferring type register 11. The transferring type register (information holding circuit) 11 of this example is configured by serially connecting flip-flops 17 and, for example, the transfer information i is shifted based on clock input and sequentially held in the flip-flops 17. Outputs Q of the respective flip-flops 17 are supplied to a DRAM memory core 12 and supplied to an adder circuit (compression circuit) 13 of an error detecting circuit 16.

The adder circuit 13 includes logic circuits which are serially connected, for example. One input terminal of each logic circuit is supplied with the output Q of a corresponding one of the flip-flops 17. In this example, as the logic circuit, for example, a logic circuit capable of detecting coincidence/non-coincidence, for example, an exclusive logical OR (which is hereinafter referred to as Ex. OR) circuit 18 is used. One input terminal of the first-stage Ex. OR circuit 18 is supplied with the output Q of the first-stage flip-flop 17 and the other input terminal thereof is supplied with expected value correcting information "a". The expected value correcting information "a" is information output from an information output circuit and, for example, it is information programmed in the fuse 14 shown in the first embodiment. The expected value correcting information "a" is information which fixes the final output of the adder circuit 13 to expected value information having a preset value. Therefore, the final output becomes an error detection output j and when it is deviated from the preset value, occurrence of an error can be detected. In this example, a case wherein an odd number of flip-flops 17 are provided is shown as an example. In this case, if transfer information i is "0", that is, if it is even (if i=a), the expected value correcting information "a" is set to "0". On the other hand, if transfer information i is "1", that is, if it is odd (Else), the expected value correcting information "a" is set to "1". As a result, the error detection output j is fixed at "0", that is, it is fixed at an even number (j=0). If the error detection output j is set at "1", that is, it is changed to an odd number, it is understood that information held in the transferring type register 11 is destroyed.

Thus, like the first embodiment, in the first circuit example according to the second embodiment, it becomes possible to detect that an error has occurred in the transferring type register 11.

One of the advantages of the first circuit example is that destruction of information can be detected only by use of an output of the adder circuit 13. Therefore, for example, the comparator circuit (detecting circuit) 15 shown in the first embodiment can be omitted and the integration density can be further enhanced.

In the first circuit example, when an even number of flip-flops 17 are used, it can be coped with by, for example, inverting the logical value of the expected value correcting information "a". This modification can be applied to second and third circuit examples described below.

Second Circuit Example

Figure 5:
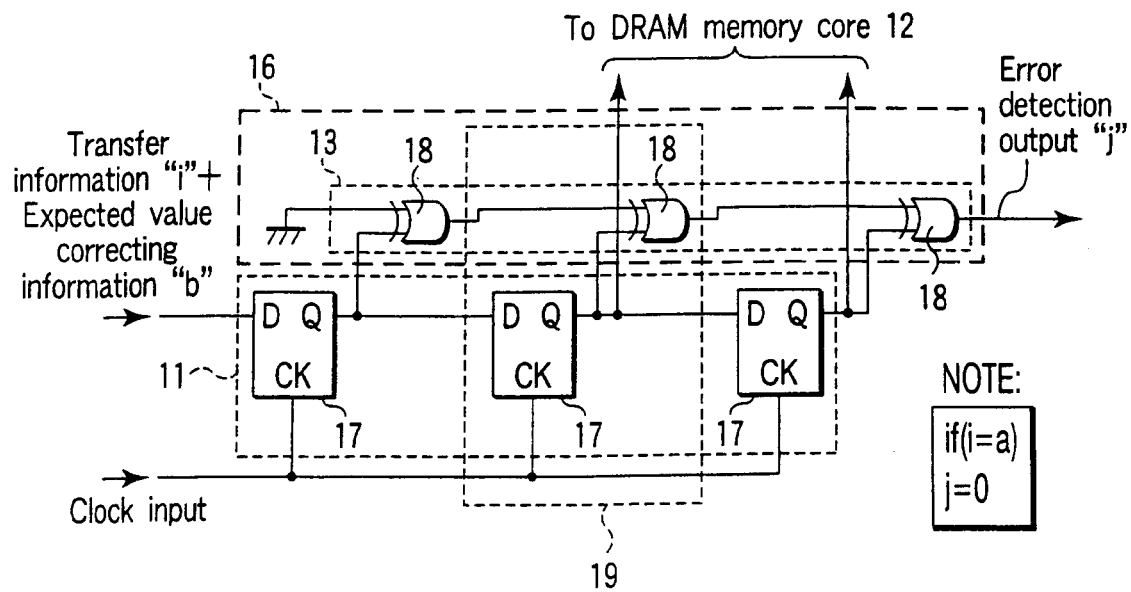
FIG. 5 is a circuit diagram showing a second circuit example of the information holding circuit and error detecting circuit of the semiconductor integrated circuit device according to a second embodiment of the present invention.

FIG. 5 is a circuit diagram showing a second circuit example of the information holding circuit and error detecting circuit of the semiconductor integrated circuit device according to the second embodiment of the present invention.

As shown in FIG. 5, in the second circuit example, expected value correcting information "b" is attached to transfer information i and transferred to the transferring type register 11. Therefore, for example, the expected value correcting information "b" is held in one of the flip-flops 17 contained in the transferring type register 11. In this example, the expected value correcting information "b" is attached to the last information of the transfer information i. Therefore, the expected value correcting information "b" is held in the first-stage flip-flop 17 of the transferring type register 11. After the end of transfer, the output Q of the first-stage flip-flop 17 is used as expected value correcting information "b". Therefore, the output Q of the first-stage flip-flop 17 is not necessarily supplied to the DRAM memory core 12. Since the operation is the same as that of the first circuit example, a note (NOTE:) is given in the drawing and the explanation thereof is omitted.

Thus, like the first embodiment, in the second circuit example according to the second embodiment, it is possible to detect occurrence of an error in the transferring type register 11. Further, the advantage obtained by the second circuit example which is the same as that obtained by the first circuit example can be attained.

In the second circuit example, the expected value correcting information "b" is attached to the transfer information i and transferred to the transferring type register 11. Therefore, for example, an advantage that an electrical wiring used to transfer the expected value correcting information "b" to the adder circuit 13 can be omitted in the first circuit example can be attained.

In the second circuit example, the input of the first-stage flip-flop 17 is input to one input terminal of a logic circuit, for example, an Ex.OR circuit 18 which receives a fixed value at the other input terminal. The Ex.OR circuit 18 can be omitted. This is because an input of the first-stage flip-flop 17 can be directly input to one input terminal of the next-stage Ex. OR circuit 18.

However, if the Ex.OR circuit 18 is added to the first-stage flip-flop 17 as shown in the second circuit example, the transferring type register 11 can be configured by repeatedly forming a circuit basic pattern (indicated by a broken line frame 19 in the drawing), for example. Therefore, the layout pattern can be simplified depending on the product and it is expected that the integration density can be enhanced.

Third Circuit Example

Figure 6:
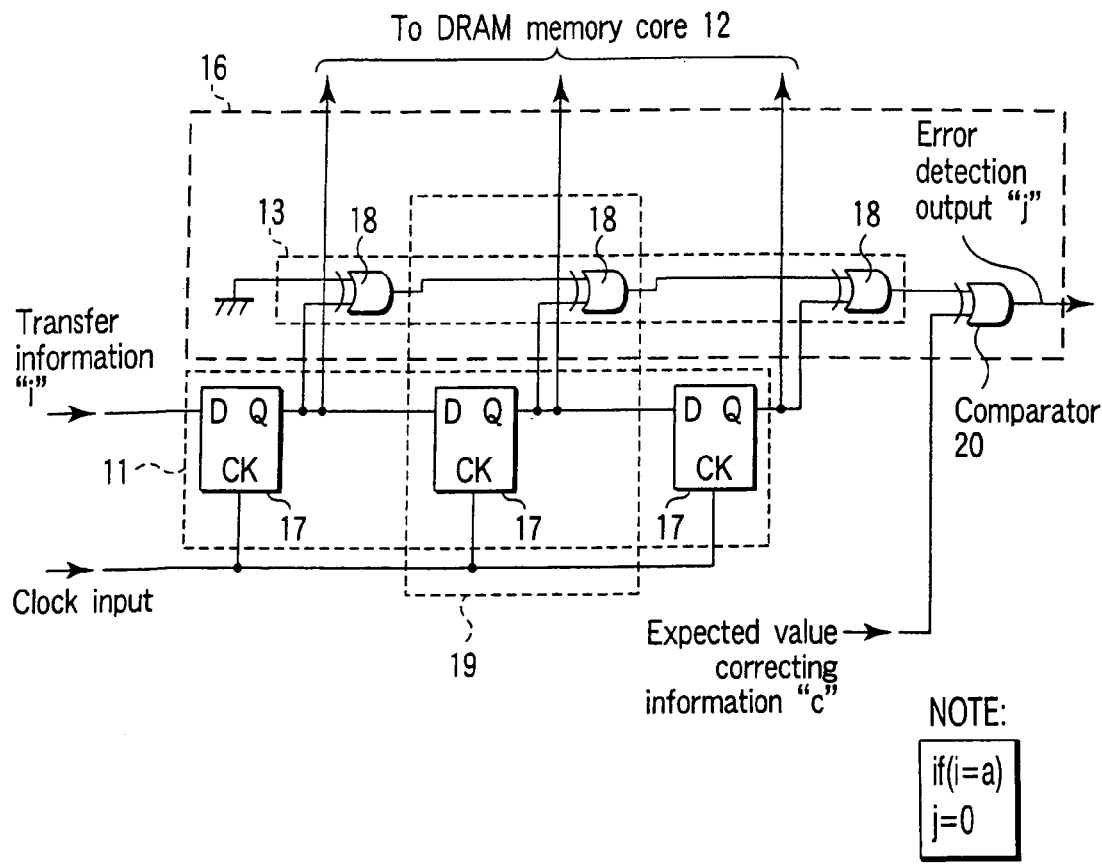
FIG. 6 is a circuit diagram showing a third circuit example of the information holding circuit and error detecting circuit of the semiconductor integrated circuit device according to the second embodiment of the present invention.

FIG. 6 is a circuit diagram showing a third circuit example of the information holding circuit and error detecting circuit of the semiconductor integrated circuit device according to the second embodiment of the present invention.

As shown in FIG. 6, the third circuit example is used to correct the final output (compression information) of the adder circuit (compression circuit) 13 to expected value information having a preset value based on expected value correcting information "c".

In the third circuit example, for example, an expected value correcting circuit having a preset value based on the final output of the adder circuit 13 and the expected value correcting information "c" is provided. In this example, the expected value correcting circuit is configured by a logic circuit, for example, a comparator circuit 20 containing an Ex.OR circuit. The final output is input to one input terminal of the comparator circuit 20 and the expected value correcting information "c" is supplied to the other input terminal thereof. Since the operation is the same as that of the first circuit example, a note (NOTE:) is given in the drawing and the explanation thereof is omitted.

Thus, like the first embodiment, in the third circuit example according to the second embodiment, it is possible to detect occurrence of an error in the transferring type register 11. Further, the advantage by the third circuit example which is the same as that by the first circuit example can be attained.

In the semiconductor integrated circuit device according to the second embodiment, the final output of the adder circuit 13 is corrected to expected value information having a preset value. Therefore, an advantage that the logic of a signal indicating occurrence of an error in the transferring type register (information holding circuit) 11 for each IP macro can be uniformly set can be attained. For example, if the expected value information from the IP macro is uniformly set at "0" and when the expected value information from any one of the IP macros is changed to "1", it is detected that an error has occurred in the transferring type register (information holding circuit) 11 for the corresponding IP macro. Thus, if the logic of a signal indicating occurrence of an error is uniformly set for each IP macro, for example, the logic can be simplified and effectively used in the system-on-chip in which a plurality of IP macros are mounted on one semiconductor chip.

Third Embodiment

In the first and second embodiments, the semiconductor integrated circuit device capable of detecting occurrence of an error in the transferring type register (information holding circuit) 11 has been explained.

The third embodiment relates to the way to deal with the semiconductor integrated circuit device after it is detected that an error has occurred.

Figure 7:
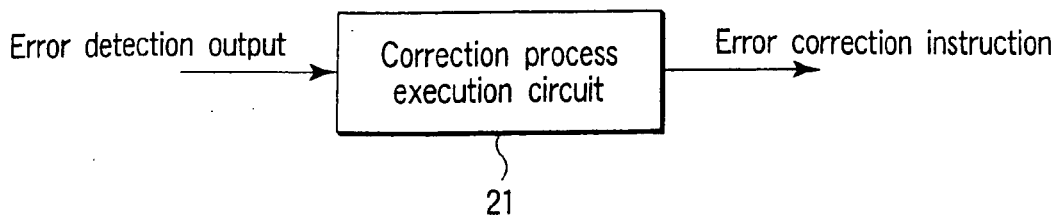
FIG. 7 is a diagram showing a correction process execution circuit provided in the semiconductor integrated circuit device according to a third embodiment of the present invention.

FIG. 7 is a diagram showing a correction process execution circuit provided in the semiconductor integrated circuit device according to the third embodiment of the present invention.

As shown in FIG. 7, a correction process execution circuit 21 is provided in the third embodiment. The correction process execution circuit 21 outputs an error correction instruction which instructs the system to make an error correction, for example, an error correction instruction signal, when an error is detected. The system executes the correction process held in the transferring type register (information holding circuit) 11 when the error correction instruction signal is output. As a result, information which is destroyed can be restored.

Various methods can be provided for the correction process. Some examples of the correction processing method are explained below.

First Correction Processing Method

Figure 8:
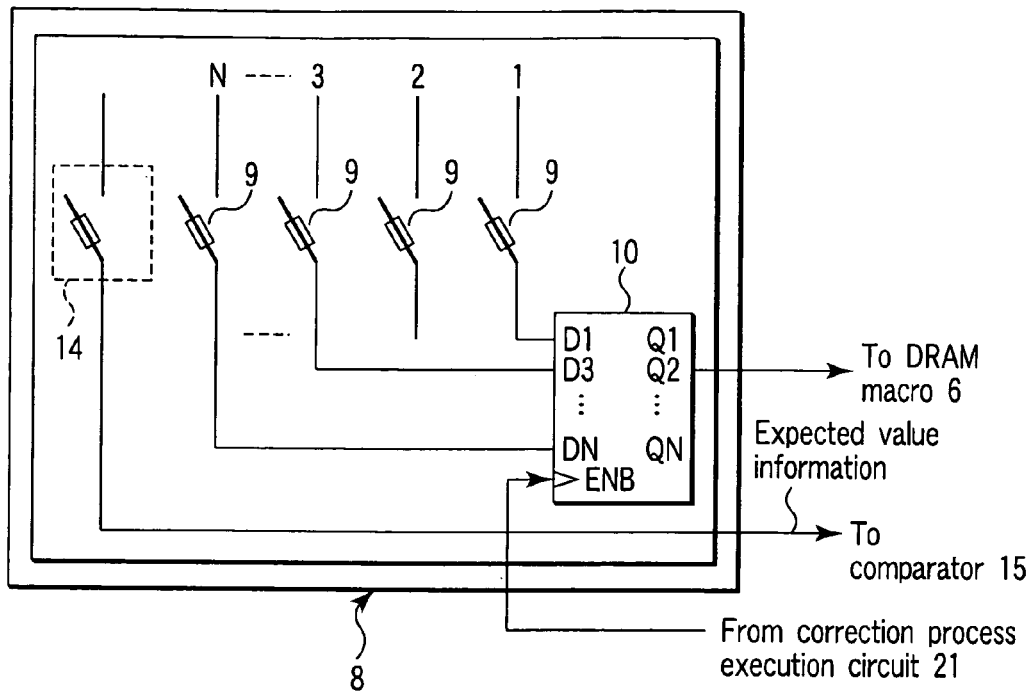
FIG. 8 is a diagram showing a first correction processing method.

FIG. 8 is a diagram showing a first correction processing method.

As shown in FIG. 8, the first correction processing method is a process to re-transfer information programmed in the fuses 9 to the transferring type register (information holding circuit) 11. In this case, for example, an enable signal ENB is re-activated based on the error correction instruction from the correction process execution circuit 21. The register 10 converts information read out in parallel from the fuses 9 into a serial form and inputs the thus converted information to the transferring type register 11 by re-activating the enable signal ENB. As a result, information programmed in the fuses 9 is held again in the transferring type register 11 and the error is corrected.

Second Correction Processing Method

Figure 9:
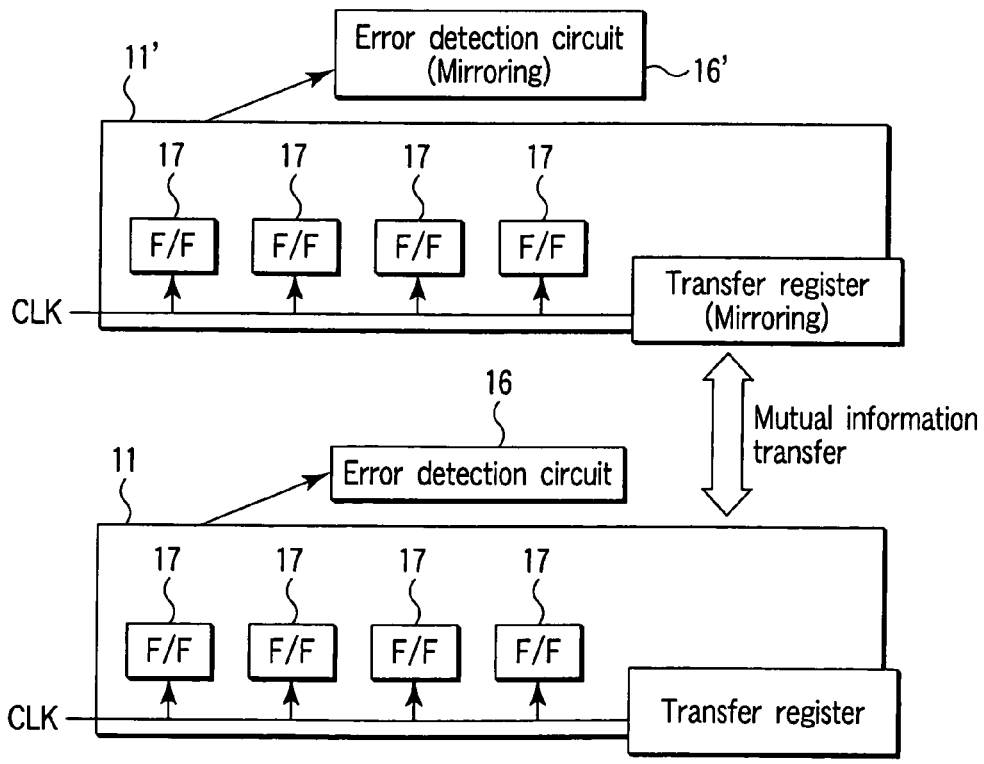
FIG. 9 is a diagram showing a second correction processing method.

FIG. 9 is a diagram showing a second correction processing method.

When the second correction processing method is carried out, a mirror-ring transferring type register 11' configured by connecting a transferring type register 11 in a mirror-ring form is separately provided. The mirror-ring transferring type register 11' is configured to hold the same information as that of the transferring type register 11. An error detecting circuit 16 is connected to the transferring type register 11. When occurrence of an error in the transferring type register 11 is detected, information held in the mirror-ring transferring type register 11' is transferred to the transferring type register 11. As a result, information held in the mirror-ring transferring type register 11' is held again in the transferring type register 11 and the error is corrected.

Further, in this example, an error detecting circuit 16' is connected to the mirror-ring transferring type register 11'. When occurrence of an error in the mirror-ring transferring type register 11' is detected, information held in the transferring type register 11 is transferred to the mirror-ring transferring type register 11'. As a result, information held in the transferring type register 11 is held again in the mirror-ring transferring type register 11' and the error is corrected.

Thus, when information of one of the transferring type register 11 and the mirror-ring transferring type register 11' is destroyed, the error can be corrected by mutually transferring information between the registers.

Further, as a system for mutually transferring information, two systems of transferring information in a serial form as shown in FIG. 10 and transferring information in a parallel form as shown in FIG. 11 are provided. One of the two systems can be selectively used as required.

In the serial transfer system of FIG. 10, when an error has occurred in the transferring type register 11, information is serially transferred from the output terminal of the mirror-ring transferring type register 11' to the input terminal of the transferring type register 11 via an electrical path 22. On the other hand, when an error has occurred in the mirror-ring transferring type register 11', information is serially transferred from the output terminal of the transferring type register 11 to the input terminal of the transferring type register 11' via an electrical path 23.

In the case of serial transfer, the correction process execution circuit 21 outputs a shift clock, for example. Information is shifted for each of the flip-flops 17 based on the shift clock.

In the parallel transfer system shown in FIG. 11, when an error has occurred in the transferring type register 11, information is transferred in a parallel form from the respective output terminals Q of the flip-flops 17 of the transferring type register 11 to the respective input terminals D of the flip-flops 17 of the mirror-ring transferring type register 11' via an electrical path 24. On the other hand, when an error has occurred in the mirror-ring transferring type register 11', information is transferred in a parallel form from the respective output terminals Q of the flip-flops 17 of the mirror-ring transferring type register 11' to the respective input terminals D of the flip-flops 17 of the transferring type register 11 via an electrical path 25.

In the case of parallel transfer, the correction process execution circuit 21 outputs an F/F output enable signal and F/F input enable signal, for example. The shift clock can be used instead of the above signals. When information is transferred in parallel from the transferring type register 11 to the mirror-ring transferring type register 11', the F/F output enable signal is supplied to the transferring type register 11 and the F/F input enable signal is supplied to the mirror-ring transferring type register 11'. On the other hand, when information is transferred in parallel from the mirror-ring transferring type register 11' to the transferring type register 11, the F/F output enable signal is supplied to the mirror-ring transferring type register 11' and the F/F input enable signal is supplied to the transferring type register 11.

Fourth Embodiment

In the third embodiment, the process performed after detection of the error has been explained. A fourth embodiment is an example which also relates to the process performed after detection of the error and in which the correction processing method is changed particularly according to the status of a system.

Figure 12:
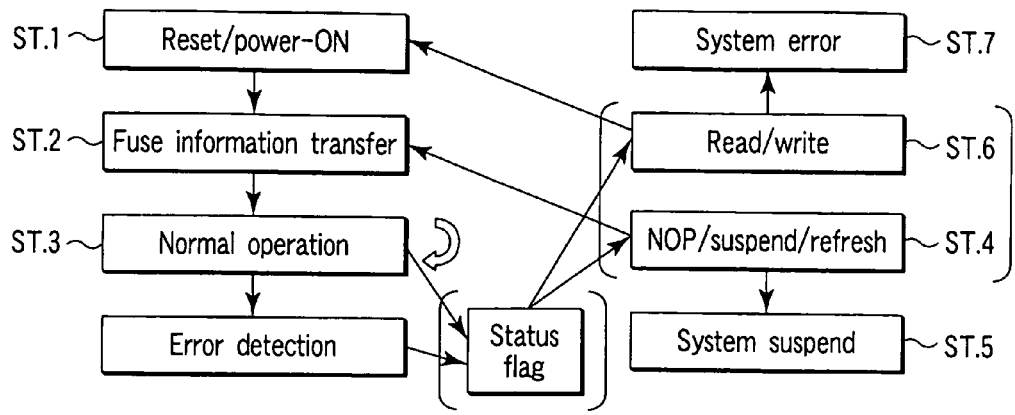
FIG. 12 is a flow diagram showing an example of a sequence of a correction processing method according to a fourth embodiment of the present invention.

FIG. 12 is a flow diagram showing an example of a sequence of the correction processing method according to the fourth embodiment of the present invention. The sequence is explained below.

As shown in FIG. 12, a power supply is turned ON (ST.1) so as to operate a semiconductor integrated circuit device. After turn-ON of the power supply is detected, for example, information is read out from the fuse box 8 and the readout information is transferred to a transferring type register 11 in an IP macro, for example, a DRAM macro 6 (ST.2). After information is held in the transferring type register 11, the semiconductor integrated circuit device is set into a normal operation mode (ST.3). In the normal operation mode, the IP macro indicates various statuses. Basically, the statuses are roughly divided into two statuses such as a status (active status) in which it transfers information with respect to another IP macro or the exterior of the chip and a status (non-active status) in which it does not transfer information with respect to another IP macro or the exterior of the chip. For example, in the semiconductor memory macro, the active status includes write and read modes and the non-active status includes non-operation (NOP) and suspend modes. In this example, the DRAM macro 6 is used as the semiconductor memory macro. In the DRAM macro 6, the active status includes write and read modes and the non-active status includes a refresh mode in addition to non-operation (NOP) and suspend modes.

In the fourth embodiment, the correction flow after detection of an error is changed according to the above statuses. Therefore, in the fourth embodiment, for example, status information, for example, a status flag indicating the status is set in the DRAM macro 6 so that the status in which the DRAM macro 6 is set can be identified. Then, in the fourth embodiment, for example, if an error is detected when the DRAM macro 6 is set in the non-active status such as the refresh, suspend or NOP mode (ST.4), a signal which sets a system suspend state is output to suspend the system (ST.5). After the system is suspended, for example, the correction operation as explained in the third embodiment is performed.

If an error is detected when the status is fatal, for example, when the DRAM macro 6 is set in the active status such as the write or read mode (ST.6), a signal which sets a system reset state, for example, a system error is issued to reset the system (ST.7). After this, the operation is started again from turn-ON of the power supply according to the reset processing instructions from the system.

Figure 13:
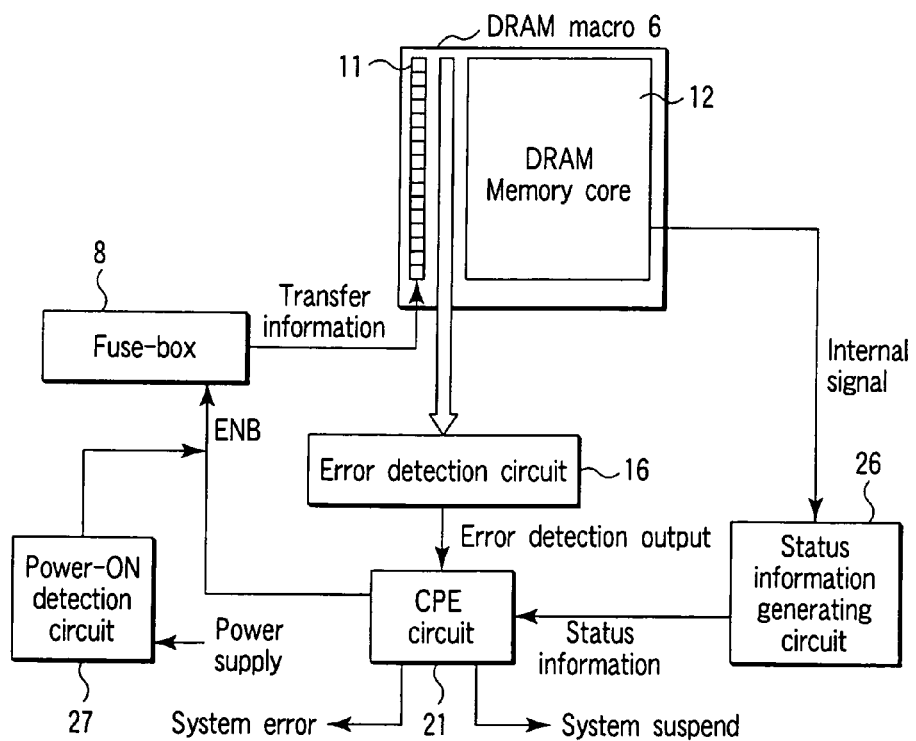
FIG. 13 is a block diagram showing one configuration example according to one sequence example.

FIG. 13 is a block diagram showing one configuration example according to one sequence example.

As shown in FIG. 13, in the above configuration example, a status information generating circuit 26 which generates status information is provided in order to identify the status of the DRAM macro 6. The status information generating circuit 26 generates corresponding status information according to the internal state of the DRAM macro 6, that is, the write, read, refresh, suspend or NOP mode. Alternatively, it generates status information according to the active status (write or read mode) or the non-active status (refresh, suspend or NOP mode). The status information is supplied to a correction process execution circuit 21. The correction process execution circuit 21 of this example outputs an error correction instruction based on the error detection output and status information. In this case, the error correction instruction depends on whether the DRAM macro 6 is set in the active status or in the non-active status.

If an error is detected when the DRAM macro 6 is set in the active status, the correction process execution circuit 21 of this example first outputs a system error (system reset) signal. Thus, the system containing the DRAM macro 6 is reset. After this, the system is re-started, a power-ON detecting circuit 27 detects turn-ON of the power supply and the same operation as that performed at the power supply turn-ON time is performed. As a result, information is transferred from the fuse box 8 to the transferring type register 11 to hold information again.

If an error is detected when the DRAM macro 6 is set in the non-active status, the correction process execution circuit 21 of this example outputs a system suspend signal to suspend the system. After this, the correction process execution circuit 21 re-activates an enable signal ENB and information is transferred from the fuse box 8 to the transferring type register 11 to hold information again.

Information on the status in which the IP macro, for example, the DRAM macro 6 is set can be acquired by detecting a signal flowing in the DRAM macro 6, for example. The signal is a command signal for the read, write, refresh or NOP mode, or a self-timer signal for the refresh mode, for example.

Fifth Embodiment

In the first and second embodiments, for example, the expected value information and expected value correcting information are previously acquired and the thus acquired information items are programmed in the fuse 14 of the information output circuit. The fifth embodiment relates to a circuit which automatically generates expected value information and expected value correcting information based on information programmed in the fuses (programmable circuit) 9. In the following description, a case wherein the expected value information is generated is explained, but it is possible to generate the expected value correcting information of the second embodiment.

Figure 14:
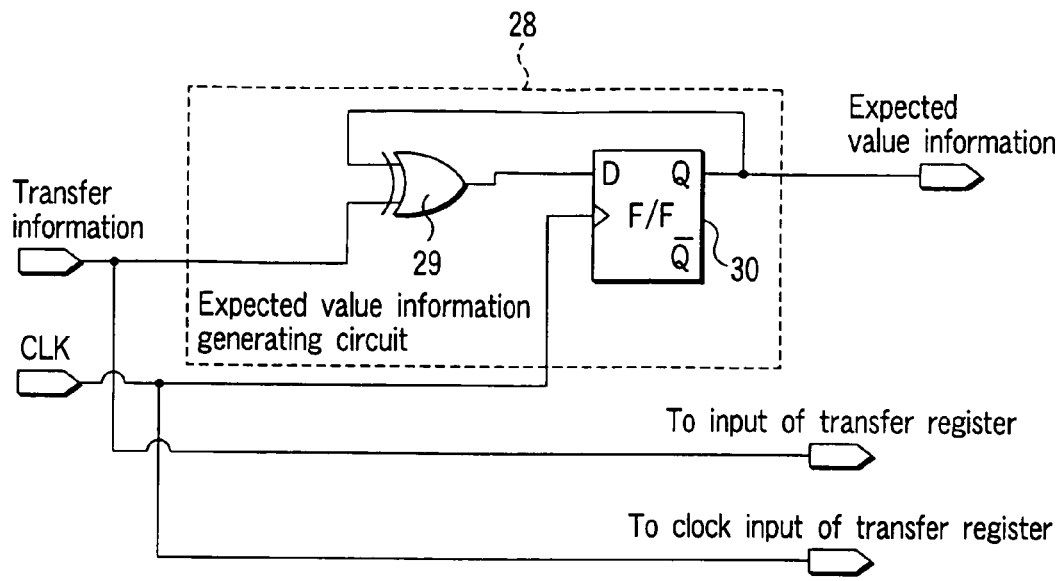
FIG. 14 is a diagram showing an expected value information generating circuit provided in a semiconductor integrated circuit device according to a fifth embodiment of the present invention.

FIG. 14 is a diagram showing an expected value information generating circuit provided in a semiconductor integrated circuit device according to the fifth embodiment of the present invention.

As shown in FIG. 14, an expected value information generating circuit 28 compresses information programmed in the fuse 9 to generate expected value information when the programmed information is held in a transferring type register (information holding circuit) 11. One example of compression is accumulative addition. In FIG. 14, the expected value information generating circuit 28 which generates expected value information based on accumulative addition is shown.

The expected value information generating circuit 28 includes a logic circuit such as an Ex. OR circuit 29 which receives transfer information output from the fuse 9 at one input terminal. An output of the Ex. OR circuit 29 is input to an input terminal D of a flip-flop 30. An output Q of the flip-flop 30 is input to the other input terminal of the Ex. OR circuit 29. The flip-flop 30 is operated in synchronism with a clock CLK to accumulatively add information corresponding to an output of the Ex. OR circuit 29 each time information is transferred, for example, and hold the result of accumulative addition. The clock CLK is a shift clock and used to shift information of the transferring type register 11, for example. Thus, the flip-flop 30 of this example is operated in synchronism with the operation of the flip-flop in the transferring type register 11. When transfer of information is completed, the final result of addition is obtained, and if the total sum of transfer information items is even, the expected value information output from the expected value information generating circuit 28 becomes even, that is, "0". On the other hand, if the total sum of transfer information items is odd, the expected value information output from the expected value information generating circuit 28 becomes odd, that is, "1".

According to the fifth embodiment having the expected value information generating circuit 28, since the expected value information can be automatically acquired based on information programmed in the fuse 9, it is not necessary to previously derive expected value information and program the same in the fuse 14, for example. Therefore, for example, time for deriving the expected value information and time for programming the same in the fuse 14 can be saved. As a result, TAT (Turn Around Time) can be reduced and, for example, a time limit for delivery of the system IC can be shortened. Further, since a memory circuit in which the expected value information is programmed, for example, the fuse 14 is not necessary, an advantage that the number of fuses can be reduced can be attained.

Figure 15:
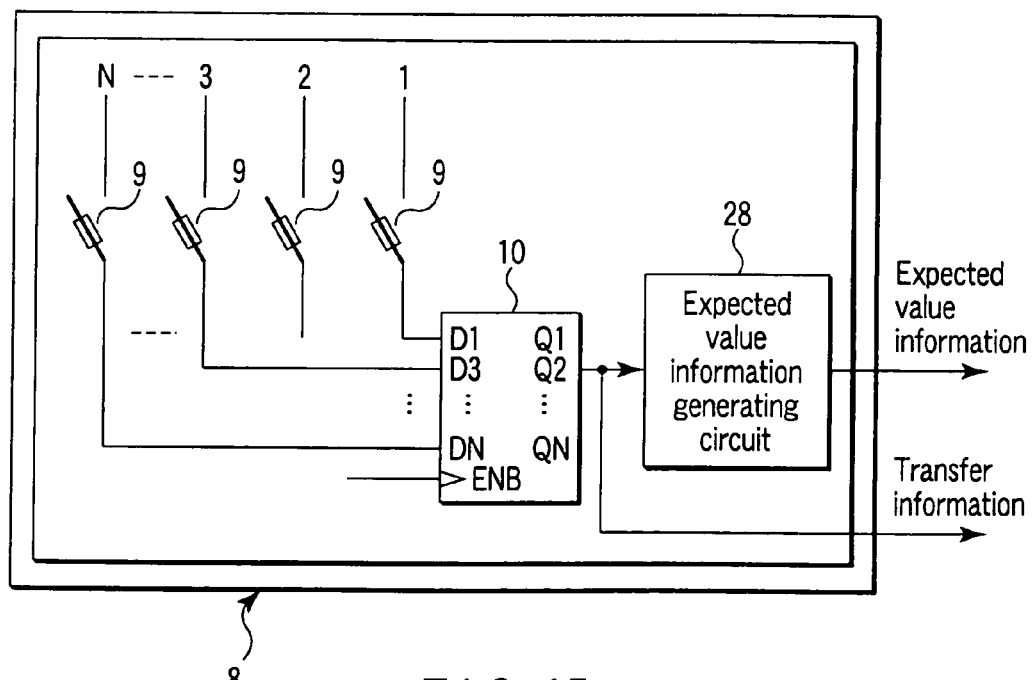
FIG. 15 is a block diagram showing one configuration example of the semiconductor integrated circuit device according to the fifth embodiment of the present invention.
Figure 16:
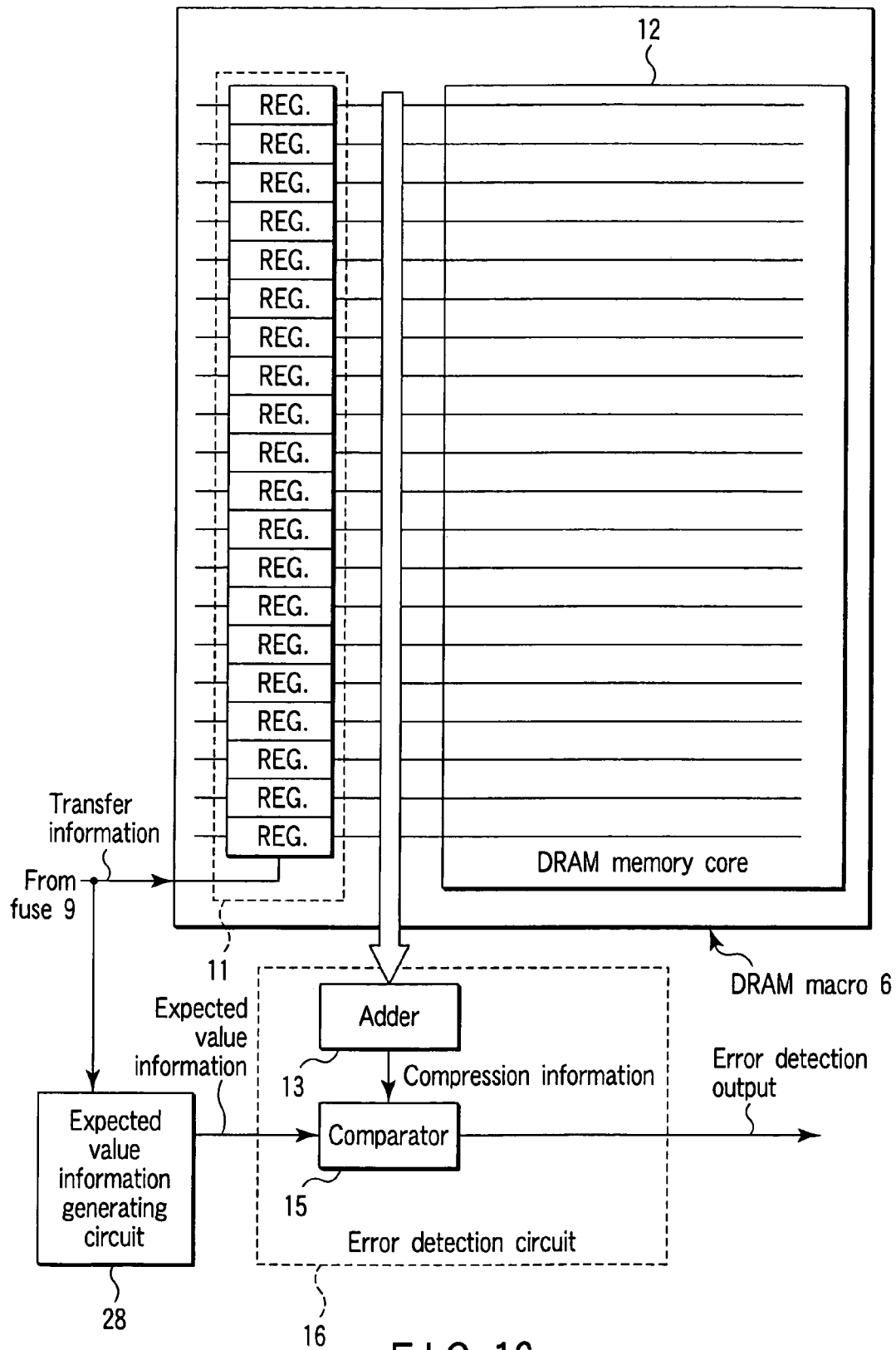
FIG. 16 is a block diagram showing another configuration example of the semiconductor integrated circuit device according to the fifth embodiment of the present invention.

The expected value information generating circuit 28 can be provided in the fuse box 8 as shown in FIG. 15, but it can also be provided outside or inside the IP macro as shown in FIG. 16.

Sixth Embodiment

In the above embodiments, the transferring type register is used as one example of the information holding circuit, but the information holding circuit can be configured by a circuit of any type if it can hold information, and is not limited to the transferring type register. For example, as shown in the sixth embodiment, synchronous type flip-flops 31 can be used. In the following description, a case wherein the synchronous type flip-flops are used is explained together with examples in which the above embodiments are generalized.

FIRST EXAMPLE

Figure 17:
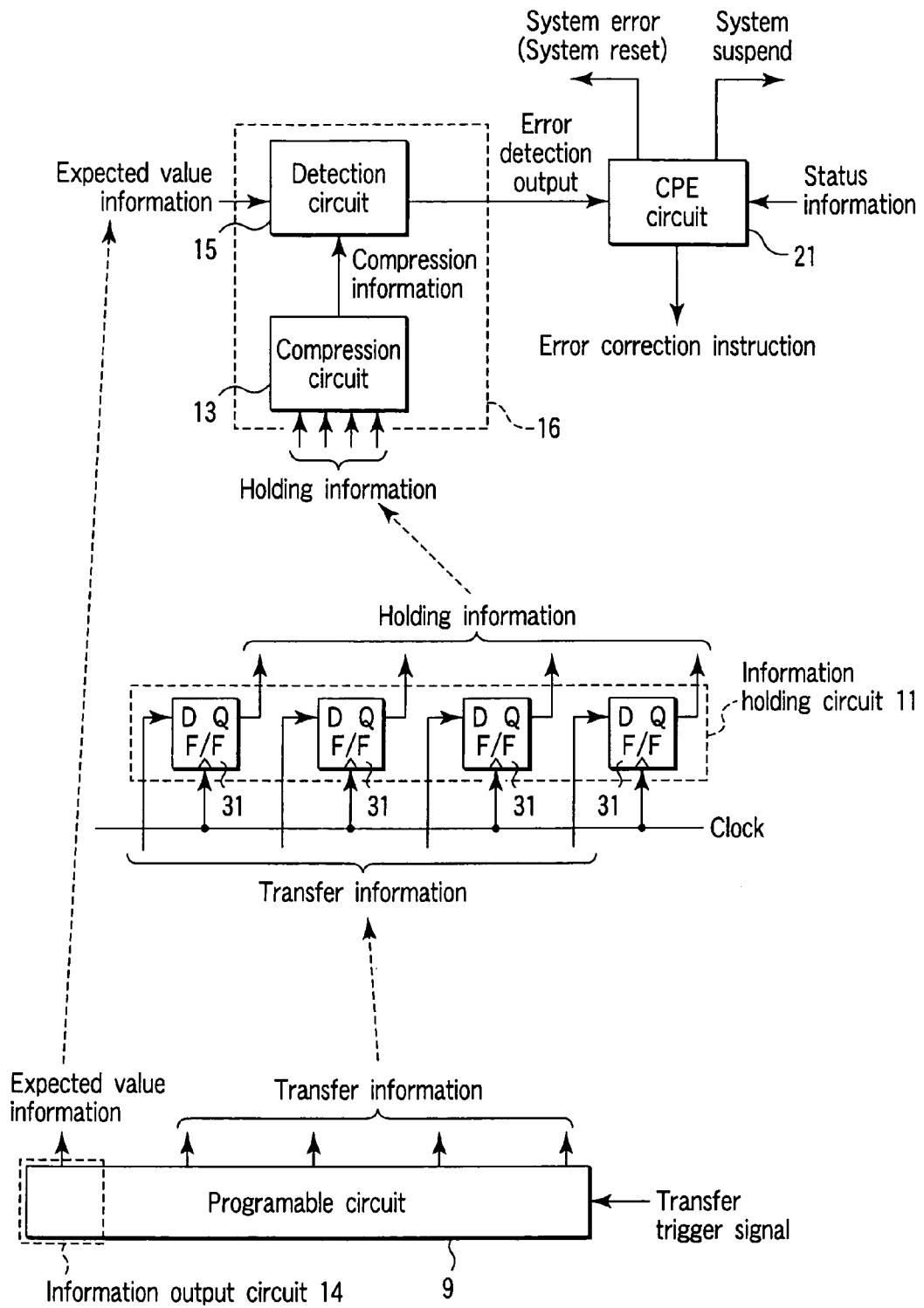
FIG. 17 is a block diagram showing an example in which the first embodiment is generalized.

FIG. 17 is a block diagram showing an example in which the first embodiment is generalized.

As shown in FIG. 17, in the first example, synchronous type flip-flops 31 are used as the information holding circuit 11. If the synchronous type flip-flops 31 are used, transfer information from a programmable circuit 9 is transferred in parallel to the synchronous type flip-flops 31, for example. One of the advantages attained by the transfer operation is that information transfer time can be reduced in comparison with a case wherein transfer information is serially transferred.

In FIG. 17, an example in which the semiconductor integrated circuit device according to the first embodiment is generalized is shown. For example, in the first embodiment, the fuses are used as one example of the programmable circuit 9, but the programmable circuit 9 can be configured by a circuit of any type if it can program information and is not limited to the fuses. For example, a read only memory (ROM) can be used. As one example of the ROM, a programmable ROM (PROM) is given and a PROM capable of electrically programming information can be given as the PROM. As the PROM capable of electrically programming information, an OTPROM capable of electrically programming information only once and an EEPROM PROM capable of rewriting information can be given. Of course, nonvolatile semiconductor memories other than the above ROMs can be used. For example, ferroelectric semiconductor memories, magneto-resistance semiconductor memories and the like can be used. The modifications of the programmable circuit can be applied to the information output circuit 14.

Further, in FIG. 17, as an example of the correction process execution circuit 21, the correction process execution circuit 21 which changes the correction process based on status information of the IP macro explained in the fourth embodiment is shown. For example, the correction process execution circuit 21 outputs a system error (system reset) signal, system suspend signal and error correction instruction signal based on status information. A transfer trigger signal is supplied to the programmable circuit 9 based on the above signals to re-transfer information. However, the correction process execution circuit 21 is not limited to this case.

SECOND EXAMPLE

Figure 18:
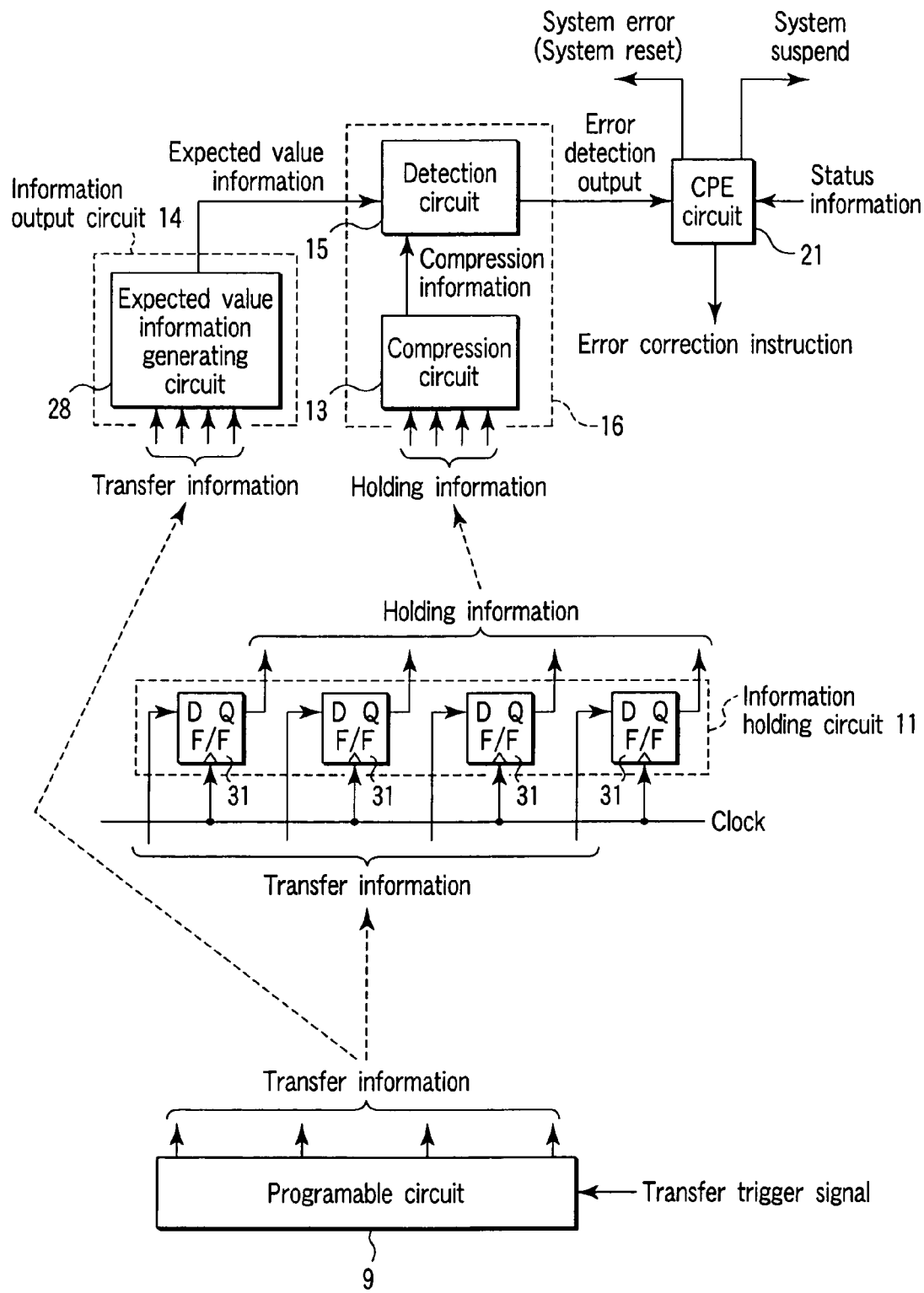
FIG. 18 is a block diagram showing an example in which the first embodiment is generalized and to which the fifth embodiment is applied.

FIG. 18 is a block diagram showing an example in which the first embodiment is generalized and to which the fifth embodiment is applied.

As shown in FIG. 18, in the second example, the expected value information generating circuit 28 explained in the fifth embodiment is applied to the information output circuit 14. The expected value information generating circuit 28 generates expected value information based on transfer information from the programmable circuit 9. Other portions are the same as those of the first example and therefore the explanation thereof is omitted.

THIRD EXAMPLE

Figure 19:
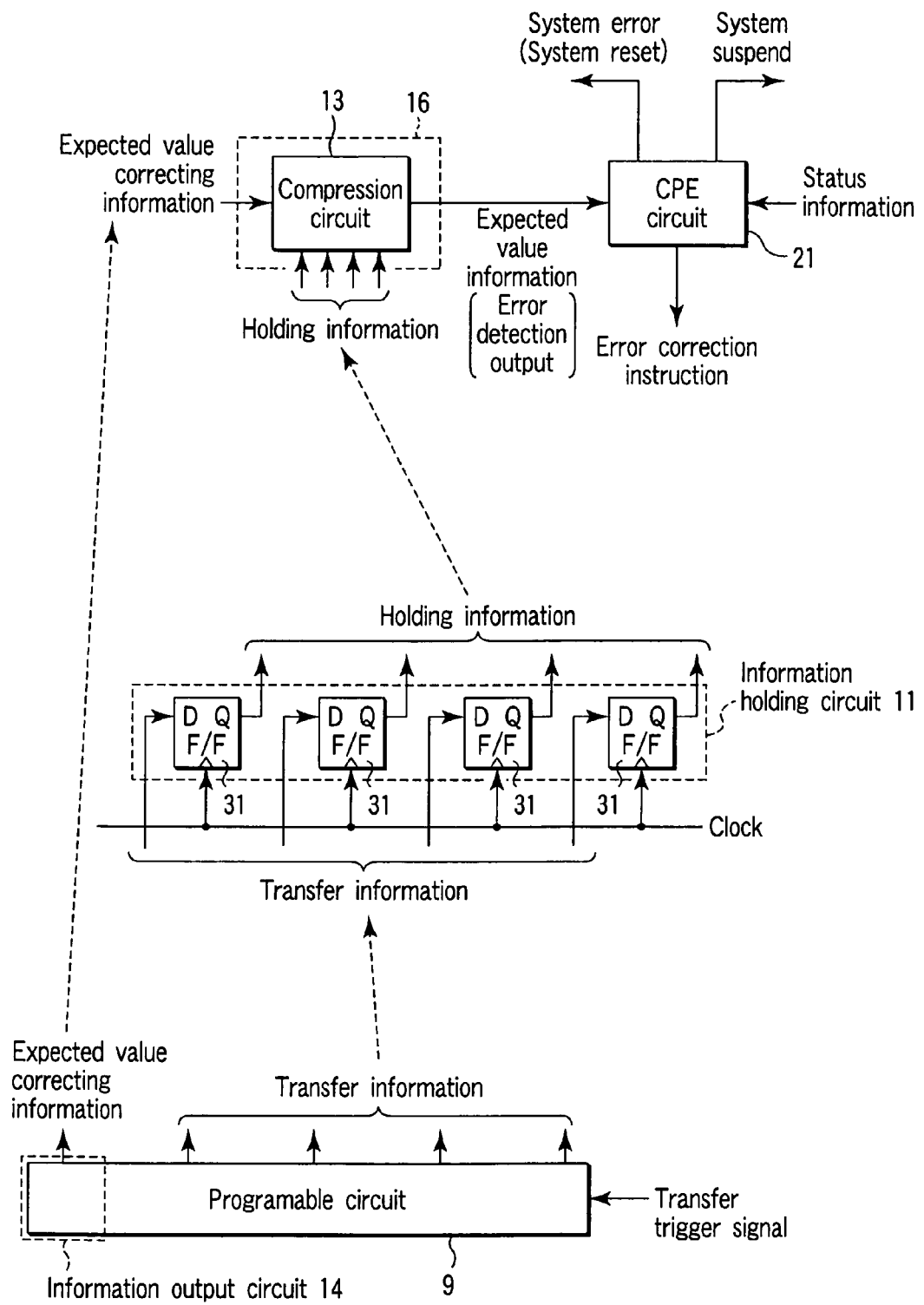
FIG. 19 is a block diagram showing an example in which the first circuit example of the second embodiment is generalized.

FIG. 19 is a block diagram showing an example in which the first circuit example of the second embodiment is generalized.

As shown in FIG. 19, in the third example, the error detecting circuit 16 explained in the first circuit example of the second embodiment is applied to the error detecting circuit 16. Other portions are the same as those of the first example and therefore the explanation thereof is omitted.

Fourth Example

Figure 20:
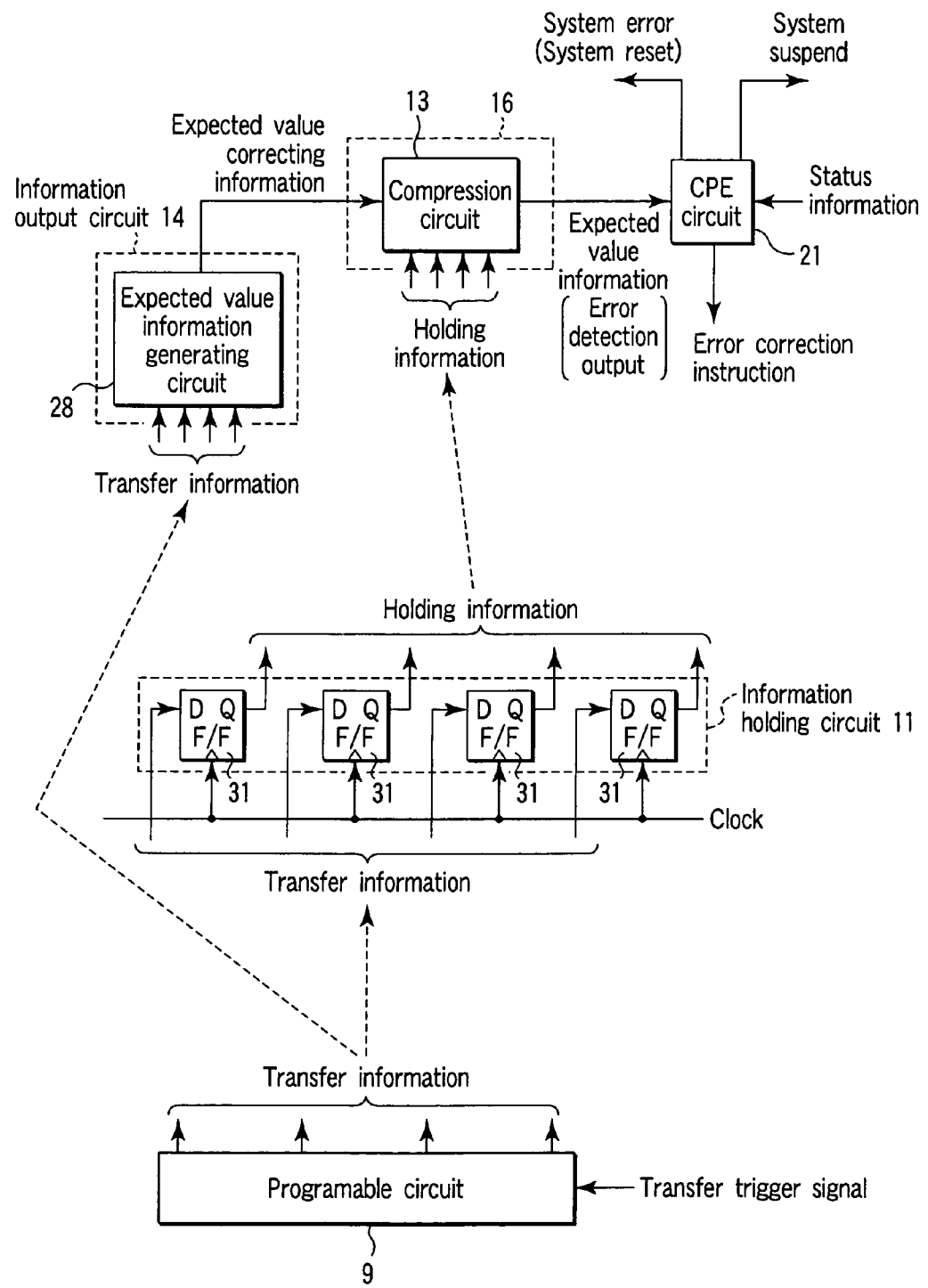
FIG. 20 is a block diagram showing an example in which the first circuit example of the second embodiment is generalized and to which the fifth embodiment is applied.

FIG. 20 is a block diagram showing an example in which the first circuit example of the second embodiment is generalized and to which the fifth embodiment is applied.

As shown in FIG. 20, in the fourth example, the expected value information generating circuit 28 explained in the fifth embodiment is applied to the information output circuit 14. Other portions are the same as those of the first example and therefore the explanation thereof is omitted.

Fifth Embodiment

Figure 21:
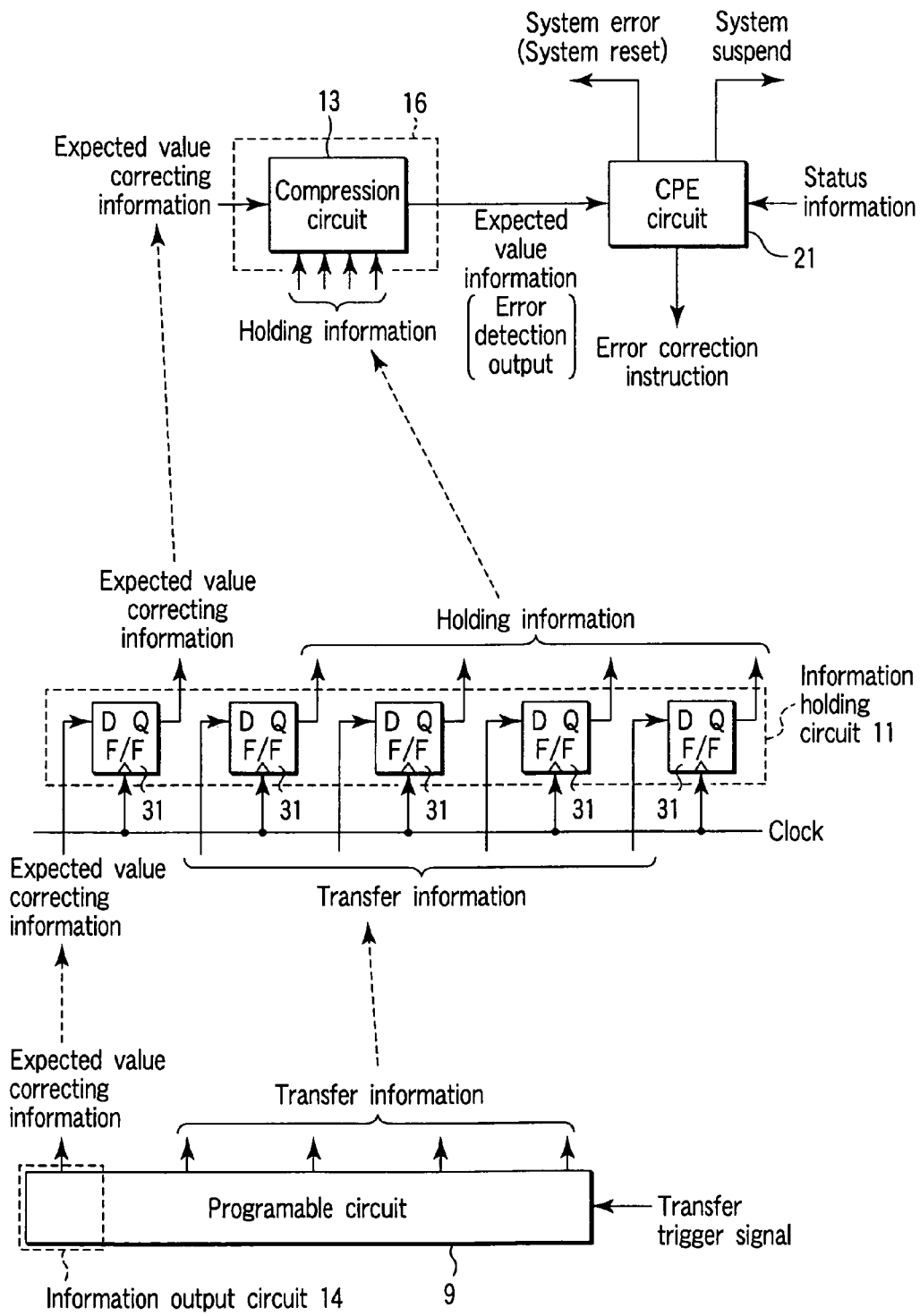
FIG. 21 is a block diagram showing an example in which the second circuit example of the second embodiment is generalized.

FIG. 21 is a block diagram showing an example in which the second circuit example of the second embodiment is generalized.

As shown in FIG. 21, in the fifth example, the information holding circuit 11, explained in the second circuit of the second embodiment, is applied to the information holding circuit 11. Expected value correcting information is held in the synchronous type flip-flops 31 of the information holding circuit 11. The thus held expected value correcting information is supplied to the compression circuit 13 of the error detecting circuit 16. Other portions are the same as those of the first example and therefore the explanation thereof is omitted.

SIXTH EXAMPLE

Figure 22:
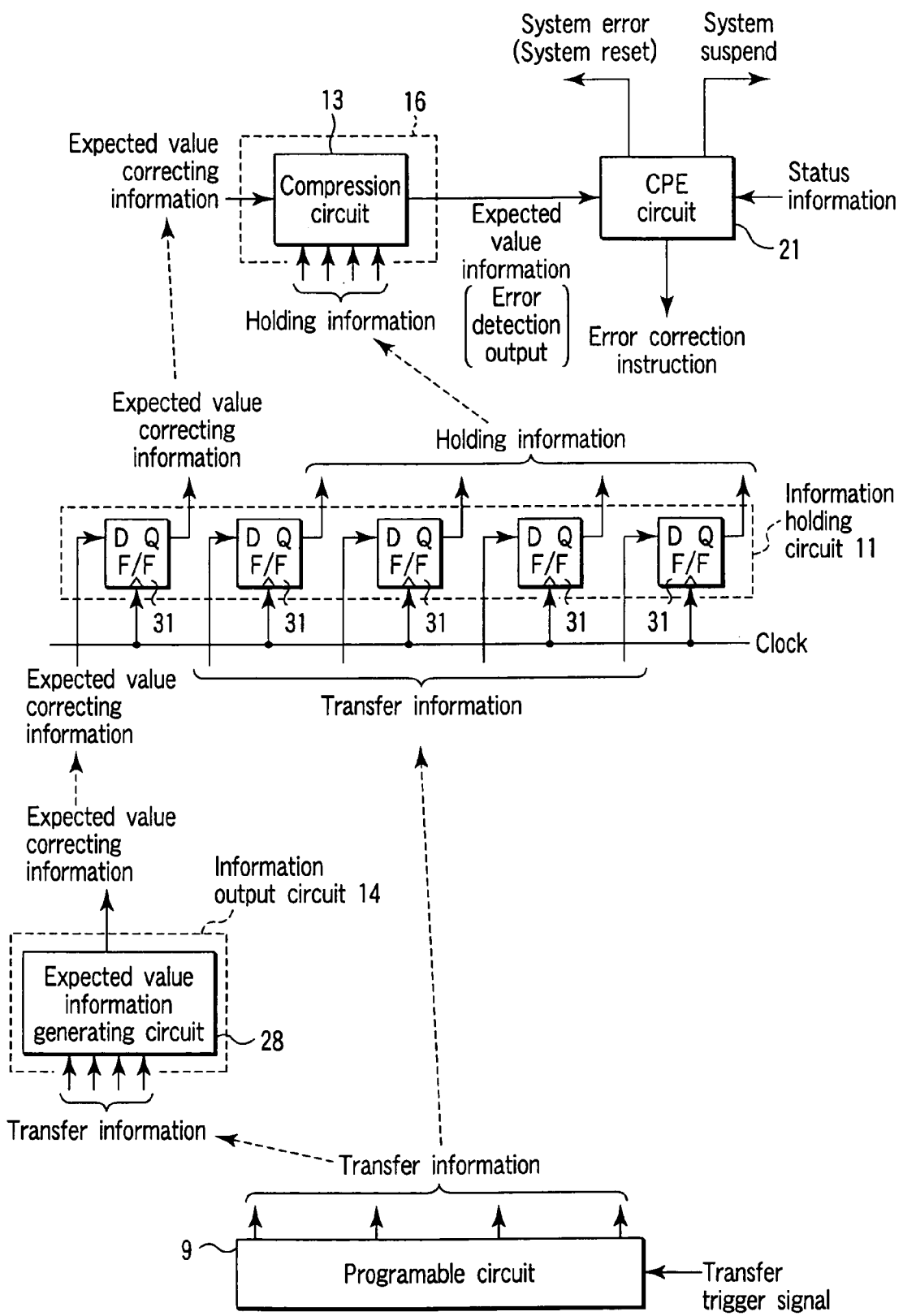
FIG. 22 is a block diagram showing an example in which the second circuit example of the second embodiment is generalized and to which the fifth embodiment is applied.

FIG. 22 is a block diagram showing an example in which the second circuit example of the second embodiment is generalized and to which the fifth embodiment is applied.

As shown in FIG. 22, in the sixth example, the expected value information generating circuit 28 explained in the fifth embodiment is applied to the information output circuit 14. Other portions are the same as those of the fifth example and therefore the explanation thereof is omitted.

Seventh Embodiment

Figure 23:
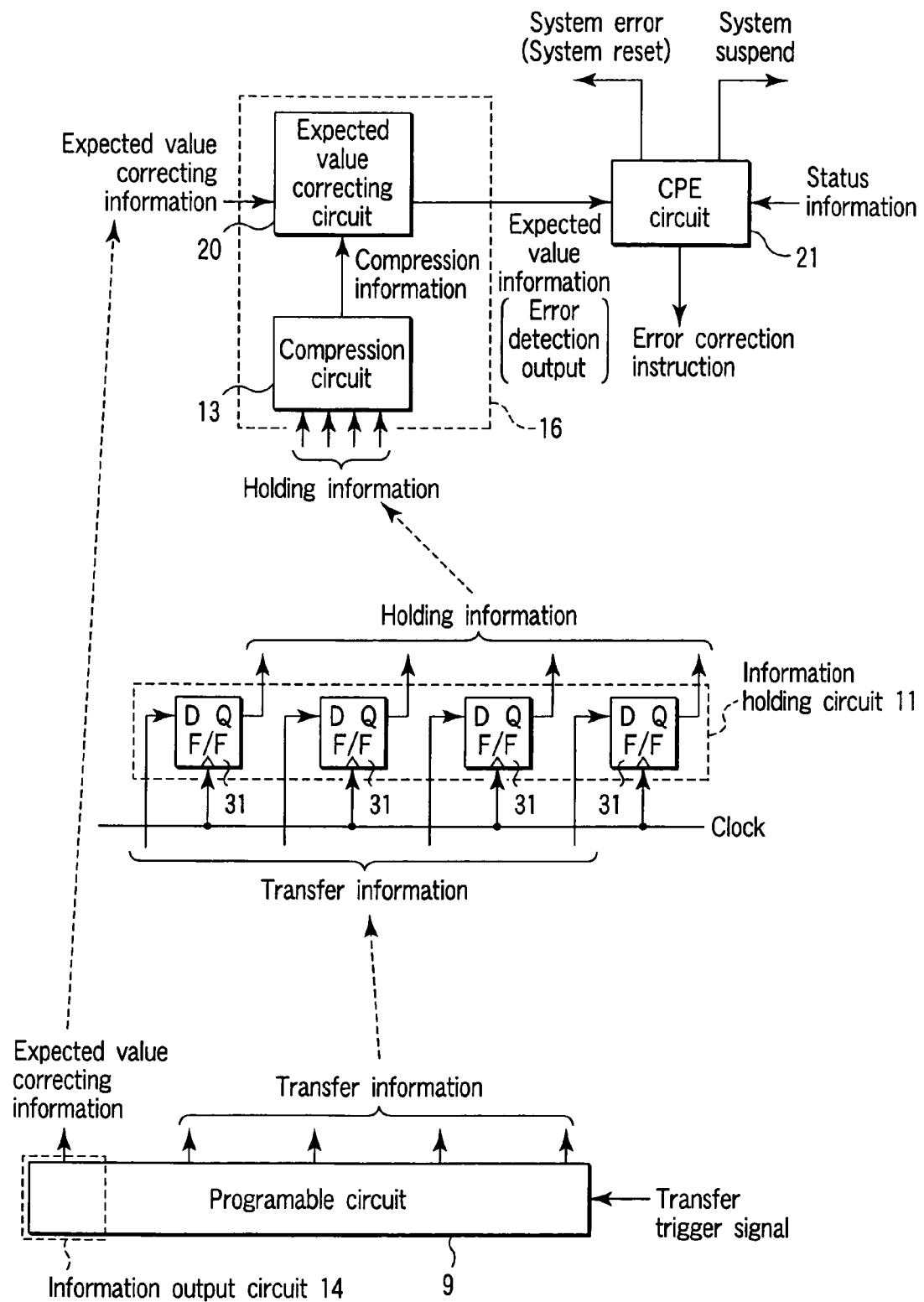
FIG. 23 is a block diagram showing an example in which the third circuit example of the second embodiment is generalized.

FIG. 23 is a block diagram showing an example in which the third circuit example of the second embodiment is generalized.

As shown in FIG. 23, in the seventh example, the information holding circuit 11 explained in the third circuit of the second embodiment is applied to the information holding circuit 11. Expected value correcting information is supplied to the expected value correcting circuit 20 of the error detecting circuit 16. The expected value correcting circuit 20 corrects expected value information based on compression information and expected value correcting information from the compression circuit 13. The expected value information can be used as an error detecting output as it is. Other portions are the same as those of the first example and therefore the explanation thereof is omitted.

EIGHTH EXAMPLE

Figure 24:
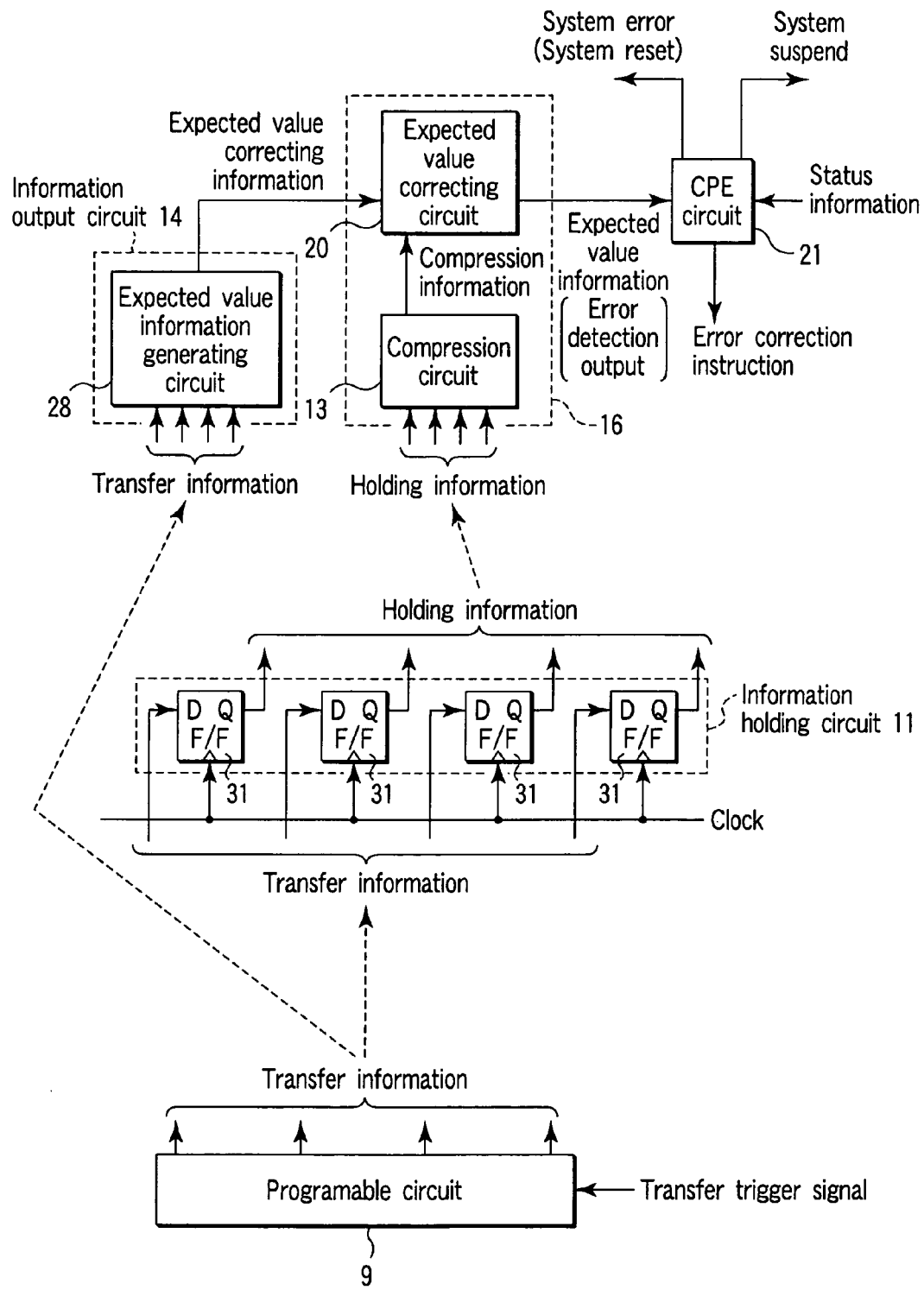
FIG. 24 is a block diagram showing an example in which the third circuit example of the second embodiment is generalized and to which the fifth embodiment is applied.

FIG. 24 is a block diagram showing an example in which the third circuit example of the second embodiment is generalized and to which the fifth embodiment is applied.

As shown in FIG. 24, in the eighth example, the expected value information generating circuit 28 explained in the fifth embodiment is applied to the information output circuit 14. Other portions are the same as those of the seventh example and therefore the explanation thereof is omitted.

Each of the semiconductor integrated circuit devices according to the above embodiments is useful for the system-on-chip technique, for example. As explained in the first embodiment, as an example of the system-on-chip, a memory hybrid logic device, for example, a DRAM hybrid logic device is given. The memory hybrid logic device can be applied to various types of systems and one system example is explained below.

System Example

In this example, a memory hybrid logic device for a digital still camera is shown as an example.

Figure 26:
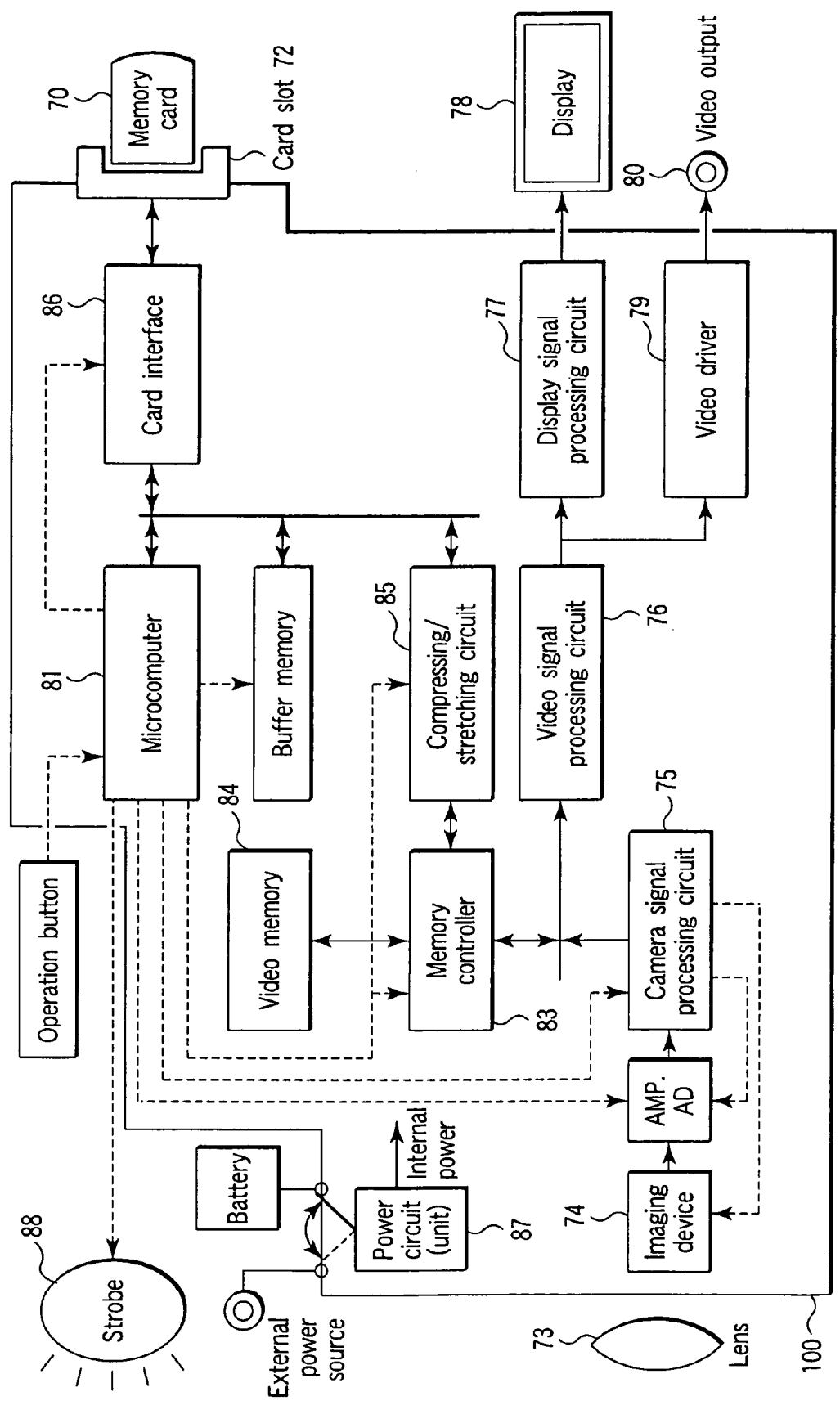
FIG. 26 is a block diagram showing a basic system of the digital still camera.

FIG. 25 is a perspective view showing a digital still camera, and FIG. 26 is a block diagram showing a basic system of the digital still camera.

As shown in FIGS. 25 and 26, in a casing of a digital still camera 71, a card slot 72 and a system IC 100 for a digital still camera connected to the card slot 72 are formed. In FIG. 25, the system IC 100 is not shown in the drawing for simplicity. A memory card 70 is removably inserted into the card slot 72 of the digital still camera 71. The memory card 70 is electrically connected to an electronic circuit of the system IC 100 when inserted into the card slot 72.

Light from a subject is converged by a lens 73 and input to an imaging device 74. The imaging device 74 photoelectrically converts the input light and outputs an analog signal, for example. As one example of the imaging device 74, a CMOS image sensor is used. The analog signal is amplified by an analog amplifier (AMP.) and then converted into a digital signal by an A/D converter (A/D). The signal converted into a digital form is input to a camera signal processing circuit 75, subjected to the automatic exposure control process (AE), automatic white balance control process (AWB) and color separation process, for example, and then converted into a luminance signal and color difference signal.

When monitoring an image, a signal output from the camera signal processing circuit 75 is input to a video signal processing circuit 76 and converted into a video signal. As a system of the video signal, for example, NTSC (National Television System Committee) can be given. The video signal is output to a display section 78 mounted on the digital still camera 71 via a display signal processing circuit 77. As one example of the display section 78, a liquid crystal monitor is used. Further, the video signal is output to a video output terminal 80 via a video driver 79. An image photographed by the digital still camera 71 can be output to a video equipment such as a television or a display of a personal computer via the video output terminal 80. Thus, it becomes possible to enjoy the photographed image on a display unit other than the display section 78. The imaging device 74, analog amplifier (AMP.), A/D converter (A/D) and camera signal processing circuit 75 are controlled by use of a microcomputer 81.

When an image is captured, an operation button, for example, a shutter button 82 is depressed. Thus, the microcomputer 81 controls a memory controller 83 and permits a signal output from the camera signal processing circuit 75 to be written into a video memory 84 as a frame image. The frame image written into the video memory 84 is compressed based on a preset compression format by a compression/expansion processing circuit 85 and recorded on the memory card 70 mounted on the card slot 72 via a card interface 86.

When a recorded image is reproduced, an image recorded on the memory card 70 is read out via the card interface 86, expanded by the compression/expansion processing circuit 85 and then written into the video memory 84. The written image is input to the video signal processing circuit 76 and displayed on the display section 78 or video equipment like the case wherein the image is monitored.

In the present example of the basic system, a case wherein the imaging device 74, analog amplifier (AMP.), A/D converter (A/D), camera signal processing circuit 75, video signal processing circuit 76, display device 77, video driver 79, microcomputer 81, memory controller 83, video memory 84 and compression/expansion processing circuit 85 are arranged in the system IC 100 is shown. Further, in the present example of the basic system, a power supply circuit 87 is also arranged in the system IC 100. The power supply circuit 87 receives power supply voltage from an external power supply or a battery to supply internal power supply voltage used in the digital still camera 71. As one example of the power supply circuit 87, a DC-DC converter is used. The internal power supply voltage is supplied as the operation power supply voltage of the above circuits and is also used as the power supply voltage of a strobe 88 and the power supply voltage of the display section 78.

Thus, each of the semiconductor integrated circuit devices according to the first to sixth embodiments can be used for a system IC, for example, a system IC for the digital still camera.

The present invention is explained with reference to the first to sixth embodiments, but this invention is not limited to the above embodiments. When embodying the invention, the invention can be variously modified without departing from the technical scope thereof.

Further, the above embodiments can be independently carried out, but they can also be appropriately combined and carried out.

In addition, the above embodiments contain inventions of various stages and the inventions of the various stages can be extracted by adequately combining a plurality of constituents disclosed in the above embodiments.

According to the above embodiments, a semiconductor integrated circuit device and an error detecting method which can detect that information held is accidentally destroyed can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a programmable circuit in which information is programmed;
   an information holding circuit which electrically holds information programmed in the programmable circuit;
   an internal circuit which operates based on information held in the information holding circuit;
   a compression circuit which compresses the information held in the information holding circuit;
   an information output circuit which outputs expected value information; and
   a detecting circuit which compares the expected value information with compression information of the information compression circuit to check destruction of information held in the information holding circuit, when the internal circuit operates.

2. The device according to claim 1, further comprising a correction process execution circuit which executes a correction process for information held in the information holding circuit when it is detected that the information is destroyed.

3. The device according to claim 2, wherein the information programmed in the programmable circuit is tested before initiating a correction process, the correction process being a process to transfer information programmed in the programmable circuit to the information holding circuit when the information held in the information holding circuit is detected as destroyed.

4. The device according to claim 2, further comprising a mirror-ring information holding circuit configured by connecting the information holding circuit in a mirror-ring form, wherein the correction process is a process in which information is mutually transferred between the information holding circuit and the mirror-ring information holding circuit to make information held in the information holding circuit coincident with information held in the mirror-ring information holding circuit.

5. The device according to claim 2, further comprising an IP macro which uses information held in the information holding circuit, and a status information generating circuit which generates status information indicating the status of the IP macro, wherein the correction process execution circuit suspends a system containing the IP macro when the IP macro is set in a non-active status and resets the system containing the IP macro when the IP macro is set in an active status.

6. The device according to claim 1, wherein the information output circuit includes an expected value information generating circuit which generates expected value information and the expected value information generating circuit compresses information programmed in the programmable circuit to generate expected value information when the programmed information is held in the information holding circuit.

7. The device according to claim 6, wherein the compression process is an accumulative addition process.

* * * * *